(12) United States Patent
Mathai et al.

(10) Patent No.: US 8,414,304 B2
(45) Date of Patent: Apr. 9, 2013

(54) ORGANIC LIGHT EMITTING DIODE LIGHTING DEVICES

(75) Inventors: Mathew K. Mathai, Gibsonia, PA (US);
Glenn Thompson, Butler, PA (US);
Mark L. Storch, Pittsburgh, PA (US);
Troy D. Hammond, Pittsburgh, PA (US)

(73) Assignee: Plextronics, Inc., Pittsburgh, PA (US)

( * ) Notice: Subject to any disclaimer, the term of this patent is extended or adjusted under 35 U.S.C. 154(b) by 153 days.

(21) Appl. No.: 12/543,225

(22) Filed: Aug. 18, 2009

(65) Prior Publication Data

US 2010/0045175 A1 Feb. 25, 2010

Related U.S. Application Data

(60) Provisional application No. 61/090,150, filed on Aug. 19, 2008.

(51) Int. Cl.
*H01J 1/62* (2006.01)
*H01L 51/54* (2006.01)
*H01R 12/00* (2006.01)

(52) U.S. Cl.
USPC ............................. 439/56; 257/E21.026

(58) Field of Classification Search .................. 439/56; 257/E21.026
See application file for complete search history.

(56) References Cited

U.S. PATENT DOCUMENTS

| | | | |
|---|---|---|---|
| 4,538,214 A | 8/1985 | Fisher et al. | |
| 4,920,467 A | 4/1990 | Honsberger et al. | |
| 5,010,463 A | 4/1991 | Ross | |
| 5,404,282 A | 4/1995 | Klinke et al. | |
| 5,721,471 A | 2/1998 | Begemann et al. | |
| 6,016,038 A | 1/2000 | Mueller et al. | |
| 6,150,774 A | 11/2000 | Mueller et al. | |
| 6,183,104 B1 | 2/2001 | Ferrara et al. | |
| 6,234,645 B1 | 5/2001 | Borner et al. | |
| 6,241,527 B1 | 6/2001 | Rast et al. | |

(Continued)

FOREIGN PATENT DOCUMENTS

| | | |
|---|---|---|
| CA | 2549232 | 12/2006 |
| CA | 2568430 | 10/2007 |

(Continued)

OTHER PUBLICATIONS

IB of WIPO, International Preliminary Report on Patentability and Written Opinion, PCT/US2009/054224, May 17, 2010, 19 pages.

(Continued)

*Primary Examiner* — Matthew W Such
*Assistant Examiner* — Robert Carpenter
(74) *Attorney, Agent, or Firm* — Foley & Lardner LLP

(57) ABSTRACT

An organic light emitting diode (OLED) device includes a substrate, an anode, a cathode, an active region including an organic material, wherein the active region is electrically coupled to the anode and the cathode, at least one coupler configured to electrically couple at least one of the anode or the cathode to a power supply, and an encapsulation that isolates the active region from an ambient environment. A lighting system can be made including a plurality of OLED devices. A lighting system can be assembled using the OLED devices from a kit. The OLED devices may be polymer light emitting diode (PLED) devices or small molecule light emitting diode (SMOLED) devices. The OLED devices can use regio-regular poly-thiophene.

35 Claims, 19 Drawing Sheets

U.S. PATENT DOCUMENTS

| | | |
|---|---|---|
| 6,255,786 B1 | 7/2001 | Yen |
| 6,441,558 B1 | 8/2002 | Muthu et al. |
| 6,515,314 B1 | 2/2003 | Duggal et al. |
| 6,565,231 B1 | 5/2003 | Cok |
| 6,608,453 B2 | 8/2003 | Morgan et al. |
| 6,661,029 B1 | 12/2003 | Duggal |
| 6,683,665 B1 | 1/2004 | Matthies |
| 6,697,262 B2 | 2/2004 | Adams et al. |
| 6,776,496 B2 | 8/2004 | Cok et al. |
| 6,777,891 B2 | 8/2004 | Lys et al. |
| 6,806,659 B1 | 10/2004 | Mueller et al. |
| 6,846,093 B2 | 1/2005 | Swaris et al. |
| 6,897,624 B2 | 5/2005 | Lys et al. |
| 7,012,585 B2 | 3/2006 | Agostinelli et al. |
| 7,014,336 B1 | 3/2006 | Ducharme et al. |
| 7,038,398 B1 | 5/2006 | Lys et al. |
| 7,064,498 B2 | 6/2006 | Dowling et al. |
| 7,108,392 B2 | 9/2006 | Strip et al. |
| 7,108,396 B2 | 9/2006 | Swaris et al. |
| 7,135,824 B2 | 11/2006 | Lys et al. |
| 7,145,125 B2 | 12/2006 | May et al. |
| 7,148,470 B2 | 12/2006 | Rains et al. |
| 7,157,694 B2 | 1/2007 | May et al. |
| 7,161,313 B2 | 1/2007 | Piepgras et al. |
| 7,175,296 B2 | 2/2007 | Cok |
| 7,178,941 B2 | 2/2007 | Roberge et al. |
| 7,186,003 B2 | 3/2007 | Dowling et al. |
| 7,198,533 B2 * | 4/2007 | Duggal et al. .............. 445/24 |
| 7,204,622 B2 | 4/2007 | Dowling et al. |
| 7,207,693 B2 | 4/2007 | Ratcliffe et al. |
| 7,241,043 B1 | 7/2007 | Wu et al. |
| 7,255,624 B2 | 8/2007 | Daftari et al. |
| 7,259,391 B2 | 8/2007 | Liu et al. |
| 7,262,753 B2 | 8/2007 | Tanghe et al. |
| 7,303,305 B2 | 12/2007 | Kennedy |
| 7,306,353 B2 | 12/2007 | Popovich et al. |
| 7,329,027 B2 | 2/2008 | Phelan et al. |
| 7,334,917 B2 | 2/2008 | Laski |
| 7,348,738 B2 | 3/2008 | Foust et al. |
| 7,354,172 B2 | 4/2008 | Chemel et al. |
| 7,365,991 B2 | 4/2008 | Aldrich et al. |
| 7,374,311 B2 | 5/2008 | Rains et al. |
| 7,387,403 B2 | 6/2008 | Mighetto |
| 7,387,405 B2 | 6/2008 | Ducharme et al. |
| 7,387,406 B2 | 6/2008 | Swaris et al. |
| 2001/0000005 A1 | 3/2001 | Forrest et al. |
| 2002/0068191 A1 | 6/2002 | Kobayashi |
| 2003/0052616 A1 | 3/2003 | Antoniadis et al. |
| 2003/0067775 A1 | 4/2003 | Nagai et al. |
| 2003/0080678 A1 | 5/2003 | Kim et al. |
| 2004/0032205 A1 | 2/2004 | Hack et al. |
| 2004/0042199 A1 | 3/2004 | Cok |
| 2004/0132344 A1 | 7/2004 | Plishner |
| 2004/0178743 A1 | 9/2004 | Miller et al. |
| 2004/0195967 A1 | 10/2004 | Padiyath et al. |
| 2005/0012103 A1 | 1/2005 | Peng |
| 2005/0110384 A1 | 5/2005 | Peterson |
| 2005/0134525 A1 | 6/2005 | Tanghe et al. |
| 2005/0134526 A1 | 6/2005 | Willem et al. |
| 2005/0207165 A1 | 9/2005 | Shimizu et al. |
| 2005/0248935 A1 | 11/2005 | Strip et al. |
| 2006/0043912 A1 | 3/2006 | Foust et al. |
| 2006/0044215 A1 | 3/2006 | Brody et al. |
| 2006/0053527 A1 | 3/2006 | Shneider |
| 2006/0077669 A1 | 4/2006 | Thielemans et al. |
| 2006/0109219 A1 | 5/2006 | Robinson et al. |
| 2006/0126338 A1 | 6/2006 | Mighetto |
| 2006/0197456 A1 | 9/2006 | Cok |
| 2006/0232962 A1 | 10/2006 | Altman et al. |
| 2006/0245213 A1 | 11/2006 | Beil et al. |
| 2006/0262544 A1 | 11/2006 | Piepgras et al. |
| 2006/0285361 A1 | 12/2006 | Cok |
| 2007/0064425 A1 | 3/2007 | Frecska et al. |
| 2007/0098334 A1 | 5/2007 | Chen |
| 2007/0125368 A1 | 6/2007 | Silverstein et al. |
| 2007/0178771 A1 | 8/2007 | Goetz et al. |
| 2007/0188427 A1 | 8/2007 | Lys et al. |
| 2007/0215870 A1 | 9/2007 | Nam |
| 2007/0263394 A1 | 11/2007 | Thielemans et al. |
| 2007/0273290 A1 | 11/2007 | Ashdown et al. |
| 2007/0274084 A1 | 11/2007 | Kan et al. |
| 2008/0002399 A1 | 1/2008 | Villard et al. |
| 2008/0080163 A1 | 4/2008 | Grote et al. |
| 2008/0087464 A1 | 4/2008 | Patterson et al. |
| 2008/0088648 A1 | 4/2008 | Nathan et al. |
| 2008/0237981 A1 | 10/2008 | Gilles et al. |
| 2009/0086478 A1 | 4/2009 | Sanroma et al. |

FOREIGN PATENT DOCUMENTS

| | | |
|---|---|---|
| CA | 2604364 | 3/2008 |
| DE | 8801246 | 3/1988 |
| DE | 202006006417 | 11/2006 |
| EP | 1391918 | 2/2004 |
| EP | 1408722 | 4/2004 |
| EP | 1457962 | 9/2004 |
| EP | 1367675 | 7/2006 |
| FR | 2836985 | 9/2003 |
| JP | 1222610 | 9/1989 |
| JP | 6-214509 | 8/1994 |
| JP | 2004363421 | 12/2004 |
| JP | 2006-278307 | 10/2006 |
| JP | 2007-172918 | 7/2007 |
| JP | 2008307084 | 12/2008 |
| TW | 256026 | 6/2006 |
| WO | WO 03/044297 | 5/2003 |
| WO | WO 2005/101513 | 10/2005 |
| WO | WO 2006/043943 | 4/2006 |
| WO | WO 2006/056066 | 6/2006 |
| WO | WO 2006/063212 | 6/2006 |
| WO | WO 2006/097763 | 9/2006 |
| WO | WO 2006/122392 | 11/2006 |
| WO | WO 2006/123335 | 11/2006 |
| WO | WO 2007/107916 | 9/2007 |
| WO | WO 2007/144365 | 12/2007 |
| WO | WO 2008/001274 | 1/2008 |
| WO | WO 2008/012702 | 1/2008 |
| WO | WO 2008/019487 | 2/2008 |
| WO | WO 2008/037450 | 4/2008 |
| WO | WO 2008/040323 A2 | 4/2008 |
| WO | WO 2008/063864 | 5/2008 |
| WO | WO 2008/068718 | 6/2008 |
| WO | WO 2008/071206 | 6/2008 |
| WO | WO 2008/099306 | 8/2008 |
| WO | WO 2008/157723 | 12/2008 |
| WO | WO 2009/115955 | 9/2009 |

OTHER PUBLICATIONS

IB of WIPO, International Preliminary Report on Patentability and Written Opinion, PCT/US2009/054231, Apr. 23, 2010, 18 pages.

IB of WIPO, International Preliminary Report on Patentability and Written Opinion, PCT/US2009/054232, May 17, 2010, 19 pages.

IB of WIPO, International Preliminary Report on Patentability and Written Opinion, PCT/US2009/054228, Jun. 2, 2010, 21 pages.

* cited by examiner

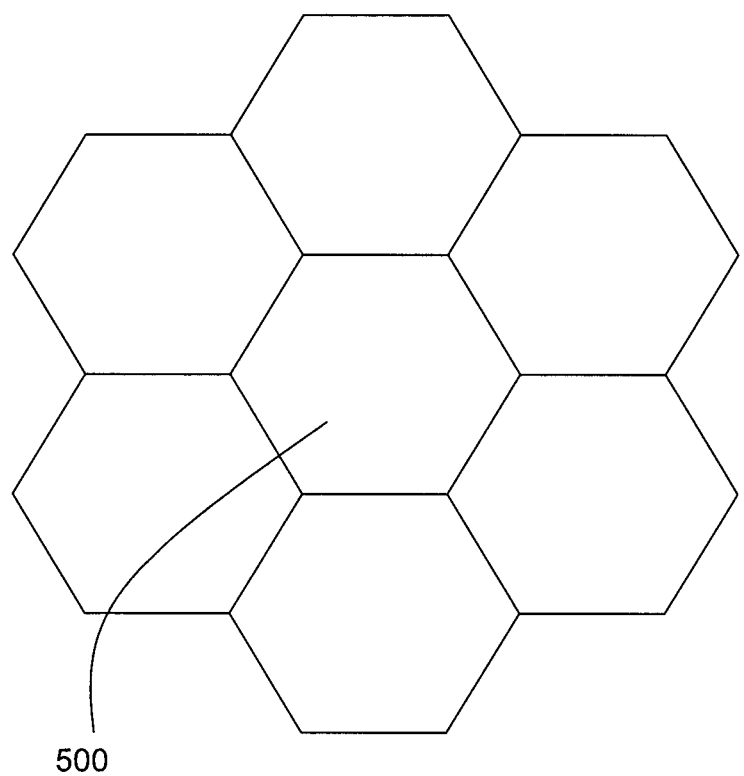
500
FIG. 5
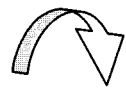 

1200

1204

ORGANIC LIGHT EMITTING DIODE LIGHTING DEVICES

CROSS-REFERENCE TO RELATED APPLICATIONS

This application claims priority to U.S. Provisional Patent Application No. 61/090,150, filed on Aug. 19, 2008, the complete disclosure of this application being hereby incorporated by reference in its entirety.

BACKGROUND

Organic light emitting diodes (OLEDs) can utilize organic small molecules or polymers that produce light when transferred into their excited state by an external power source. Accordingly, OLED devices may be referred to as polymer light emitting diode (PLED) devices or small molecule organic light emitting diode (SMOLED) devices depending on their active compositions. Earlier OLEDs were typically based on relatively simple structures, where a thin layer of the electroluminescence (EL) conjugated polymer was enclosed between a pair of electrodes. When a voltage is applied to the electrodes, the positive (anode) and the negative (cathode) electrodes can provide injection of holes and electrons, respectively, into the EL polymer. In the EL polymer layer, electrons and holes move towards each other in the applied electrical field and form excitons, which are bound excited states that can relax down into the ground state radiatively by emitting a photon. This process can be referred to as electroluminescence. OLED devices are of interest in, for example, display, signage, and lighting.

OLEDs were first designed in the 1980's, see, e.g., C. W. Tang, S. A. Van Slyke, Organic electroluminescent diodes, *Appl. Phys. Lett.* 1987, 51, 913. More recent developments in OLED materials and applications are generally described in Kraft et al., *Angew. Chem. Int. Ed.*, 1998, 37, 402-428, and Z., Li and H. Meng, *Organic Light-Emitting Materials and Devices* (Optical Science and Engineering Series), CRC Taylor & Francis (Sep. 12, 2006). The disclosures of these references are incorporated by reference in their entirety.

SUMMARY

Described herein are embodiments which include, among other things, devices, articles, instruments, apparatuses, kits, systems, and the like, and methods of making and methods of using same. More specifically, the various embodiments described herein generally relate to individual light emitting diode (LED) devices, and lighting systems comprising LEDs. In particular, the embodiments are related to the use of organic light emitting diodes (OLED) in lighting.

In one aspect, an OLED device is provided. The OLED device includes a substrate, an anode, a cathode, an active region comprising an organic material, wherein the active region is electrically coupled to the anode and the cathode with at least one coupler configured to electrically couple at least one of the anode or the cathode to a power supply, and an encapsulation that isolates the active region from an ambient environment.

In another aspect, an OLED device is provided, which includes a substrate, an anode, a cathode, and an active region comprising an organic material, wherein the active region is electrically coupled to the anode and the cathode, at least one coupler configured to electrically couple at least one of the anode or the cathode to a power supply, and an encapsulation that isolates the active region from an ambient environment, wherein the active region comprises a plurality of vertically-stacked light emitting layers. The light emitting layers may be interlaced with multiple electrodes such that the light emitting layers may be individually addressed and controlled.

In another aspect, an OLED device is provided, which includes a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material, and wherein the first and second light emitting layers are electrically coupled to their respective first and second anodes and cathodes.

In another aspect, a lighting kit of pre-manufactured modular OLED devices is provided. The OLED devices may include OLED devices of different colors, shapes, or sizes, each OLED device including a substrate, an anode, a cathode, and an active region including an organic material, wherein the active region is electrically coupled to the anode and the cathode, at least one coupler configured to electrically couple at least one of the anode or the cathode to a power supply, and an encapsulation that isolates the active region from an ambient environment.

In another aspect, an OLED device is provided, which includes a substrate, an anode, a cathode, an active region comprising an organic material, wherein the active region is electrically coupled to the anode and the cathode, an encapsulation that isolates the active region from an ambient environment, and a plurality of electrodes, wherein at least one of which is electrically isolated from the active region of the OLED device. The electrically isolated electrodes may be used to provide an electrical connection between couplers, to pass current from one OLED device to the next without activating the OLED device.

In another aspect, a lighting system is provided. The lighting system includes a plurality of organic light emitting diode (OLED) devices, wherein each of the OLED devices includes a substrate, an anode, a cathode, an active region comprising an organic material, wherein the active region is electrically coupled to the anode and the cathode, at least one coupler configured to electrically couple at least one of the anode or the cathode to a power supply, and an encapsulation that isolates the active region from an ambient environment.

In another aspect, a lighting system is provided. The lighting system includes a plurality of OLED devices and a plurality of couplers that have indentations or protrusions oriented in the lateral direction to connect to OLED device edges. Each of the OLED devices includes a substrate, an anode, a cathode, an active region comprising an organic material, wherein the active region is electrically coupled to the anode and the cathode, and an encapsulation that isolates the active region from an ambient environment.

In another aspect, an OLED device is provided. The OLED includes multiple electrodes, wherein at least one electrode is electrically isolated from the active region of the OLED device.

In another aspect, a coupler is provided. The coupler includes indentations or protrusions, wherein the coupler is configured to provide at least one of an electrical or mechanical coupling of at least one OLED device to a mount or to another OLED device.

At least one advantage from at least one embodiment is that the OLED device is a "plug and play" device and can be readily placed into a system and/or replace an existing device.

The encapsulation and the coupler allow the OLED device to be a standalone device.

At least another advantage from at least one embodiment is the large area light emitting source as a result of using organic materials. The ease of manufacturing, and the tunable color with the desirable visual effect are provided by the organic material.

BRIEF DESCRIPTION OF FIGURES

FIG. 5 is a top plan view of a plurality of example hexagonal OLED devices tightly arranged into a matrix;

DETAILED DESCRIPTION

Introduction

All references cited in this application are hereby incorporated by reference in their entirety.

The use of organic materials in electroluminescent devices offers several desirable properties, for example, increased luminescence of the device; lower threshold voltage; ease of processability of materials and components during device fabrication; the ability to use spin casting, drop casting, and printing techniques to apply different layers in electroluminescent devices; the ability to prepare flexible electroluminescent devices; the ability to prepare low-weight electroluminescent devices; and the ability to prepare low-cost electroluminescent devices.

An electroluminescent device generally can be an electrochemical device that converts electrical current to electromagnetic radiation. In particular, OLEDs provide an efficient way to produce light at low voltage and minimal radiant heat. These devices currently find uses in many consumer electronics such as displays, signage, and lighting. OLEDs are generally known in the art as described in, for example, *Organic Light-Emitting Materials and Devices*, edited by Li and Meng, 2007.

Plug-In OLED Device for a Lighting System

Figure 1:
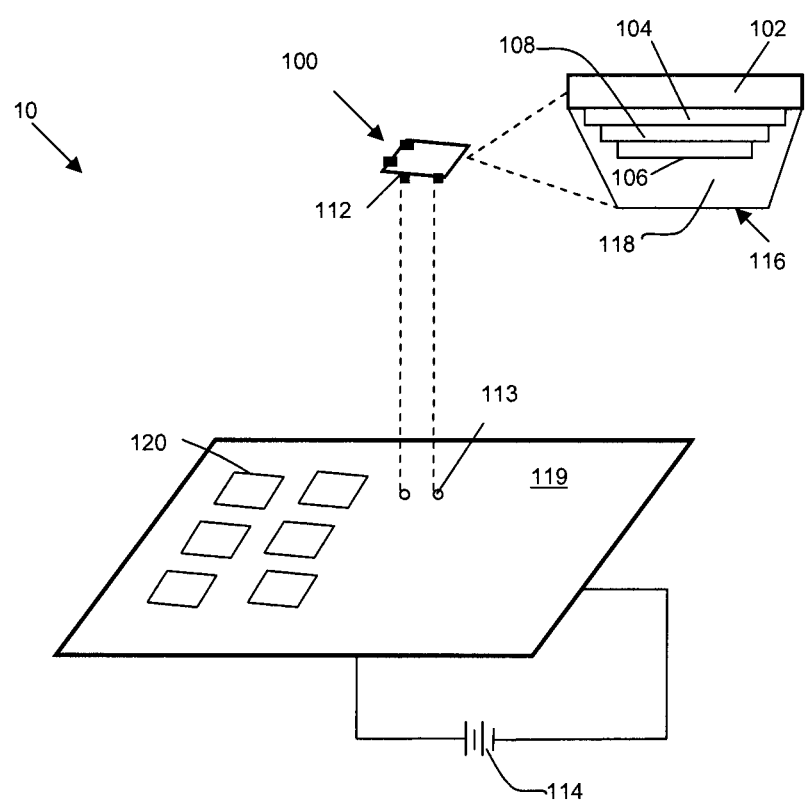
FIG. 1 is a perspective view of an example OLED device implemented in a lighting system.

An example OLED device 100 is illustrated in FIG. 1 as part of a lighting system 10. The OLED device 100 can comprise a substrate 102, an anode 104, a cathode 106, and an active region 108. The active region 108 comprises an organic material, and is electrically coupled to the anode 104 and the cathode 106. The active region 108 is configured to emit a broadband emission spectrum, for example, with a full width at half maximum (FWHM) larger than about 50 nm. The OLED device 100 has a typical structure with the anode adjacent to the substrate and the cathode over the active region. An inverted structure can also be used in which the cathode is adjacent to the substrate and the anode is over the active region.

The OLED device 100 can have a plurality of couplers 112 configured to couple the OLED device 100 to a mount 119 through indentations 113. The couplers 112 can be mechanical couplers, or can be used also to electrically couple the anode 104 or the cathode 106 to a power supply 114 through the mount 119. In one embodiment, the couplers 112 are used for both electrical coupling and mechanical coupling. The couplers may be fixedly or removably attached to the OLED device.

The OLED device 100 also can have an encapsulation 116 that isolates the active region 108 from an ambient environment. In particular, the encapsulation 116 prevents water vapor and oxygen from entering the enclosure 118 to interact with the organic material in the active region 108. With the couplers 112 and the encapsulation 116, the OLED device 100 may be readily used as a standalone device, or may be dropped into a lighting system to replace another device.

The couplers 112 may be configured to electrically couple at least one of the anode 104 or the cathode 106 with the power supply 114 via the mount 119. The mount 119 may also be referred to as the "system substrate," which provides a frame onto which the lighting system can be built. In addition to mechanical support, the mount 119 can also provide electrical paths for the OLED devices. The mount 119 may be flat or curved. The mount 119 can be flexible, and the resulting lighting system can flexible in shape. The mount 119 may comprise one or more rails to which OLED devices are slidably coupled. The mount may be configured to be free-standing, ceiling mounted, or wall mounted. Since OLEDs are Lambertian emitters, the mount needs not be designed to mix the light of OLEDs of various emission spectra.

Some of the couplers 112 may be configured to electrically couple at least one of the anode 104 or the cathode 106 with the power supply 114 via a second OLED device 120. By selecting a plurality of OLED devices, a lighting system may be built with a desired color, pattern, area, and brightness.

In addition to the electrical coupling, the couplers 112 may also mechanically couple the OLED device with the mount 119 or with one or more OLED device 120.

Substrate

Substrates are generally known in the art. Descriptions of various substrates may be found in, for example, Z., Li and H. Meng, *Organic Light-Emitting Materials and Devices* (Optical Science and Engineering Series). The substrate 102 of the OLED device 100 can be, for example, a solid substrate or a flexible substrate. The substrate can comprise, for example, an inorganic material or an organic material. The substrate can be, for example, made from glass, metal foil, or plastic. The substrate can be, for example, flat or curved. The substrate can be, for example, rigid, flexible or conformable. The substrate can be, for example, transparent, translucent, or opaque.

Anode

Anodes are generally known in the art. The anode 104 of the OLED device 100 can be transparent to the light emitted from the OLED device 100. The anode 104 may comprise, for example, indium tin oxide (ITO). ITO in the form of thin layers (e.g., about 100 nm thick) is substantially transparent to visible light. Substantially transparent layers desirably allow a visible light transmission of about 70% or more. ITO has a relatively high work function that helps the injection of holes into the active region 108. The ITO may be coated on a glass or plastic substrate.

Cathode

Cathodes are generally known in the art. The cathode 106 of the OLED device 100 can also be transparent. The cathode 106 may comprise, for example, a thin metal film such as aluminum or calcium, or a non-metal conductive layer. The cathode 106 may comprise a layer which is a combination of organic and inorganic components. The cathode 106 typically has a relatively low work function to help injecting electrons into the active region 108. The cathode 106 can be at least 100-200 nm thick.

The active region refers generally to the region where electrons and holes recombine to radiate photons. In the claimed embodiments, the active region comprises an organic material, and the radiative photon energy may correspond to the energy difference between the lowest unoccupied molecular orbital (LUMO) level and the highest occupied molecular orbital (HOMO) level of the organic material. Photons of lower energy/longer wavelength may be generated by higher-energy photons through fluorescent or phosphorescent processes.

The active region can comprise a light emitting layer. The active region can comprise multiple layers, for example, a combination of p- and n-type layers. The p- and n-type materials may be bonded to each other. The bonding can be ionic or covalent bonding. The multiple layers of the active region may form heterostructures therebetween.

The active region may be manufactured by known methods including, for example, spin casting, drop casting, slot die coating, vapor deposition or sputtering, crystalline growth, patterned etching, dip coating, or by printing techniques such as ink jet printing, off-setting, transfer processes, or by spray applications.

Organic Material

The organic material in the active region 108 may include an electroluminescent polymer. The polymer may be a fluorescent emitter, a phosphorescent emitter or a combination of fluorescent and phosphorescent emitters. The polymer may include, for example, polyphenylene vinylene, or polyfluorene. The polymers are often engineered to substitute side chains onto the backbone to tune the color or to improve the processing of the polymers.

Alternative to a polymer emitter, a small molecule emitter comprising for example, organo-metallic chelates or conjugated dendrimers, may be used.

The organic material may be doped with phosphorescent material.

Electrical Coupling

The electrical coupling between the active region 108 and the anode 104 or cathode 106 may be a direct-contact coupling, or indirect coupling through more layers as discussed in detail below.

Power Supply

The power supply 114 may comprise a battery, an adapter, or may be part of a power grid. The OLED devices may be powered by AC or DC current.

Coupler

The OLED device in accordance with the claimed embodiments may comprise a coupler for coupling the OLED device with a mount or with one or more other OLED devices. The resulting OLED device is pre-manufactured in a modular fashion such that the OLED device may be a "plug-and-play" device. The OLED device can be readily "plugged in" to a system to reconfigure the color, appearance, brightness, or other properties of the system, or replace an existing OLED device in the system. The coupler can provide mechanical or electrical coupling. In addition, the coupler can provide a combination of electrical and mechanical coupling In the embodiment shown in FIG. 1, the couplers 112 include those for coupling the OLED device 100 onto a mount 119, and those that can be configured to couple to one or more other OLED devices.

Figure 2A:
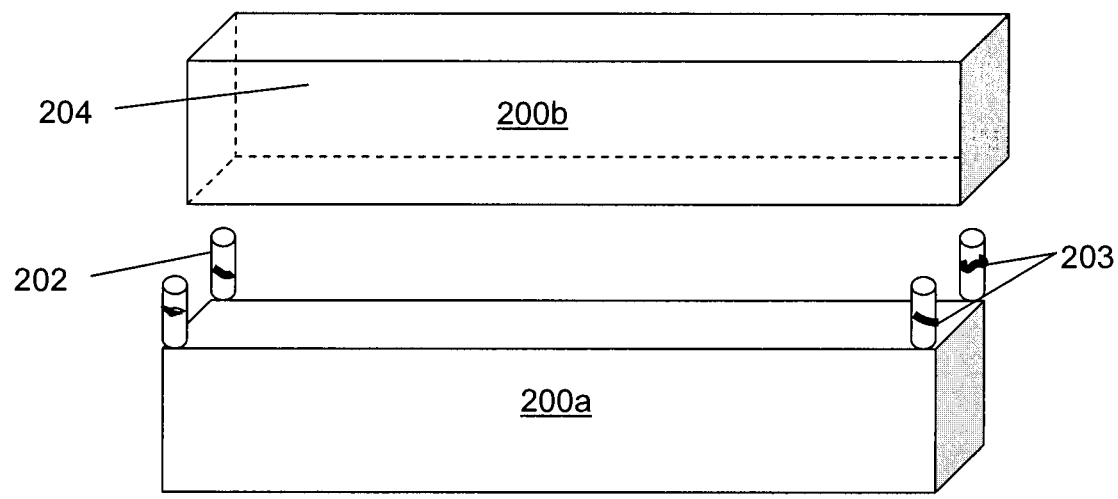
FIGS. 2A, 2B, 2C, and 2D are perspective views of example OLED device couplers.

In one embodiment as illustrated in FIG. 2A, a coupler 200a may comprise a plurality of protrusions 202 configured to couple to a complementary indentation 204 in a corresponding coupler 200b. The lateral dimension of the indentation 204 substantially matches the spacing of the protrusions 202. The indentations may be holes or slots in the OLED device. The protrusions 202, or the coupler 200b, or both, may be slightly flexible. This can be achieved, for example, by making the couplers 200a and 200b using plastics. By plugging the protrusions 202 into the indentation 204, a removable, yet stable coupling can be realized. The interlocking mechanism resembles that of the LEGO™ building blocks. The corresponding coupler 200b may be part of the mount, or part of a second OLED device.

The protrusions 202 may have conductive and/or insulating patterns 203 disposed thereon, which may be electrically coupled to corresponding conductive regions (not shown) in the indentations 204 to make electrical connections when the couplers 200a, 200b are joined together. These conductive regions may be electrically connected to at least one of the anode or cathode or a power supply. The conductive regions of the couplers may be configured to provide an electrical connection between the OLED device electrodes and a power supply when corresponding couplers are joined.

Figure 2B:
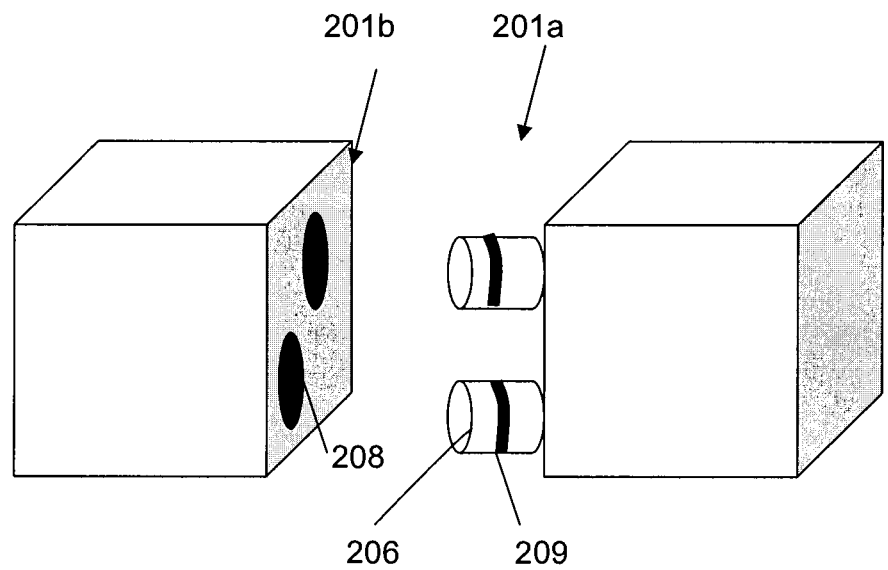

In one embodiment as illustrated in FIG. 2B, a coupler 201a may comprise one or more protrusions 206 configured to be coupled into corresponding indentations 208 in a corresponding coupler 201b. The protrusions 206 may have conductive patterns 209 disposed thereon, which may be electrically coupled to corresponding conductive regions (not shown) in the indentations 208 to make electrical connections when the couplers 201a, 201b are joined together. Thus, in addition to making the mechanical coupling, the couplers also function as electrical coupling.

Figure 2C:
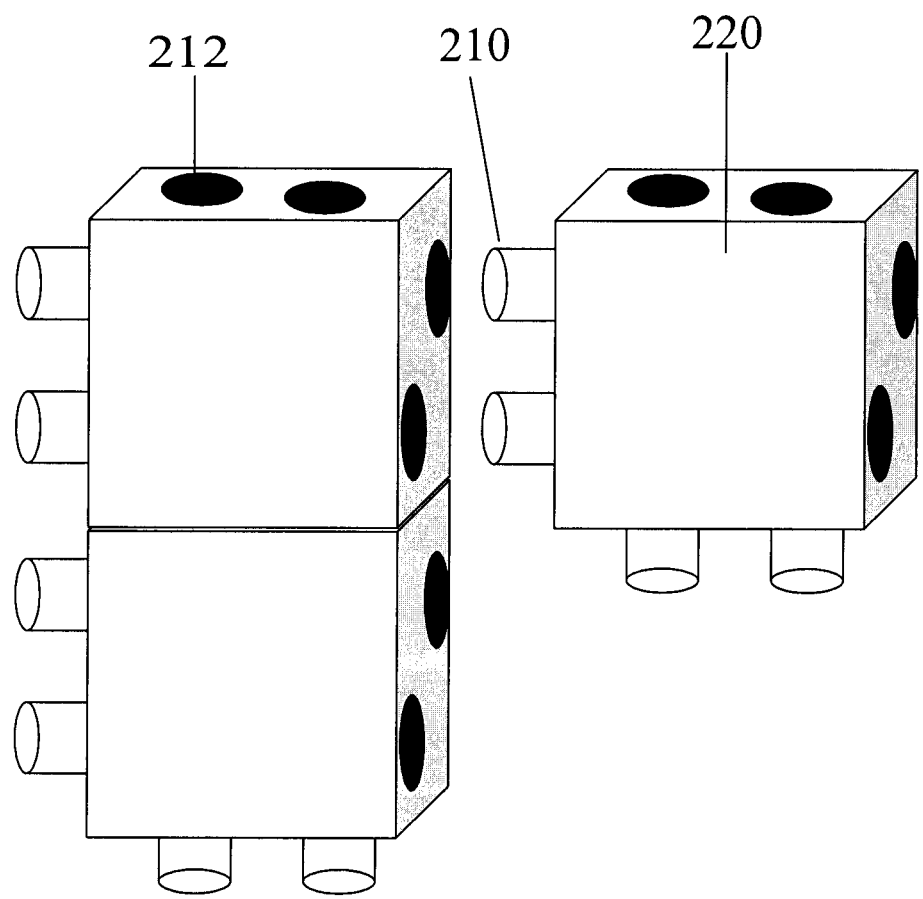

In one embodiment as illustrated in FIG. 2C, the protrusions 210 and indentations 212 for coupling may be positioned laterally and located on the edges of the OLED device 220, rather than being oriented perpendicular to the plane of the OLED device. In this case, the OLED devices may be coupled to each other or to a mount at the device edges. When OLED devices are coupled to one another, conductive regions on coupler protrusions or indentations may electrically connect the device anodes to one another and the device cathodes to one another. At least one of the OLED devices would be coupled to a power supply, possibly through a mount. The other OLED devices may be coupled to the power supply through their connection to the chain of OLED devices. In this embodiment, the joined OLED devices would be commonly driven by the power supply.

FIG. 2C shows each OLED device as having two protrusions on two edges of the OLED device, and the remaining two edges having two indentations. Each edge may have a protrusion or indentation connecting to the OLED device anode, and a protrusion or indentation connecting to the OLED device cathode. The OLED device protrusions and indentations may be designed to facilitate simultaneous coupling of two adjacent edges of an OLED device to two other OLEDs, e.g., coupling the OLED device into a step. This may be achieved by flexible protrusions, for instance. While FIG. 2C shows two protrusions or indentations on an edge, other configurations are possible. For instance, one of four edges of a chip may comprise two protrusions, one connected to the OLED device anode and another to the OLED device cathode. The remaining three sides may have anode and cathode indentations. A network of devices can be made.

In the embodiments shown in FIGS. 1-2C, the couplers are attached to, or are part of, the OLED devices. As discussed below, in some other embodiments, couplers may be provided separately from the OLED devices and may be provided as part of a lighting kit for assembling OLED devices into a lighting system.

Figure 2D:
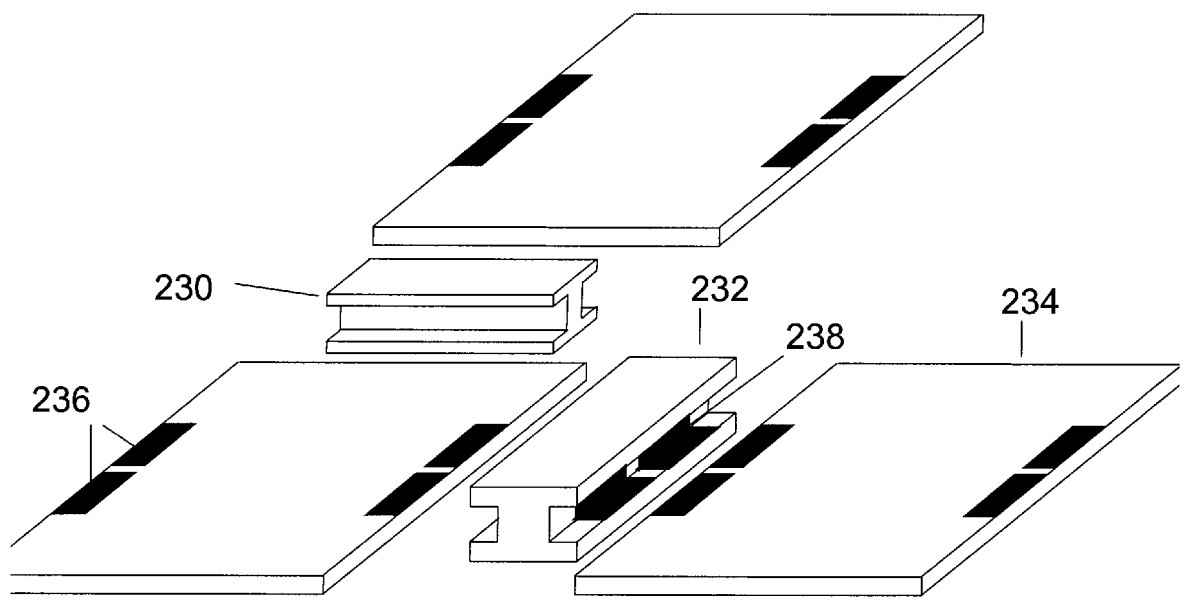

FIG. 2D shows examples of couplers 230, 232 that are provided separately from the OLED devices 234. The couplers may be configured to removably couple a plurality of OLED devices together in a lateral direction at the OLED device edges. The couplers may provide electrical coupling, or mechanical coupling as in the coupler 230. In a preferred embodiment, some of the couplers may provide a combination of electrical and mechanical coupling, as in the coupler 232. Electrical coupling is made by establishing a connection of the OLED device electrodes 236 with conductive paths 238 of the coupler.

In a lighting system or kit comprising a plurality of couplers and OLED devices, at least one coupler is configured to be electrically coupled to a power supply. The coupler may directly couple to a power supply or indirectly couple to a power supply through, for examples, a mount, wires, or another OLED device. In some embodiments, the couplers comprise multiple conductive paths to supply various drive conditions to the OLED devices. In one example, the coupler may comprise four conductive paths. One conductive path may serve as an electrical connection to ground and the remaining three paths may deliver various drive conditions, such as various voltages V1, V2, and V3. The drive conditions may be selected to appropriately drive red, green, and blue OLED devices, respectively, for instance.

Figure 2E:
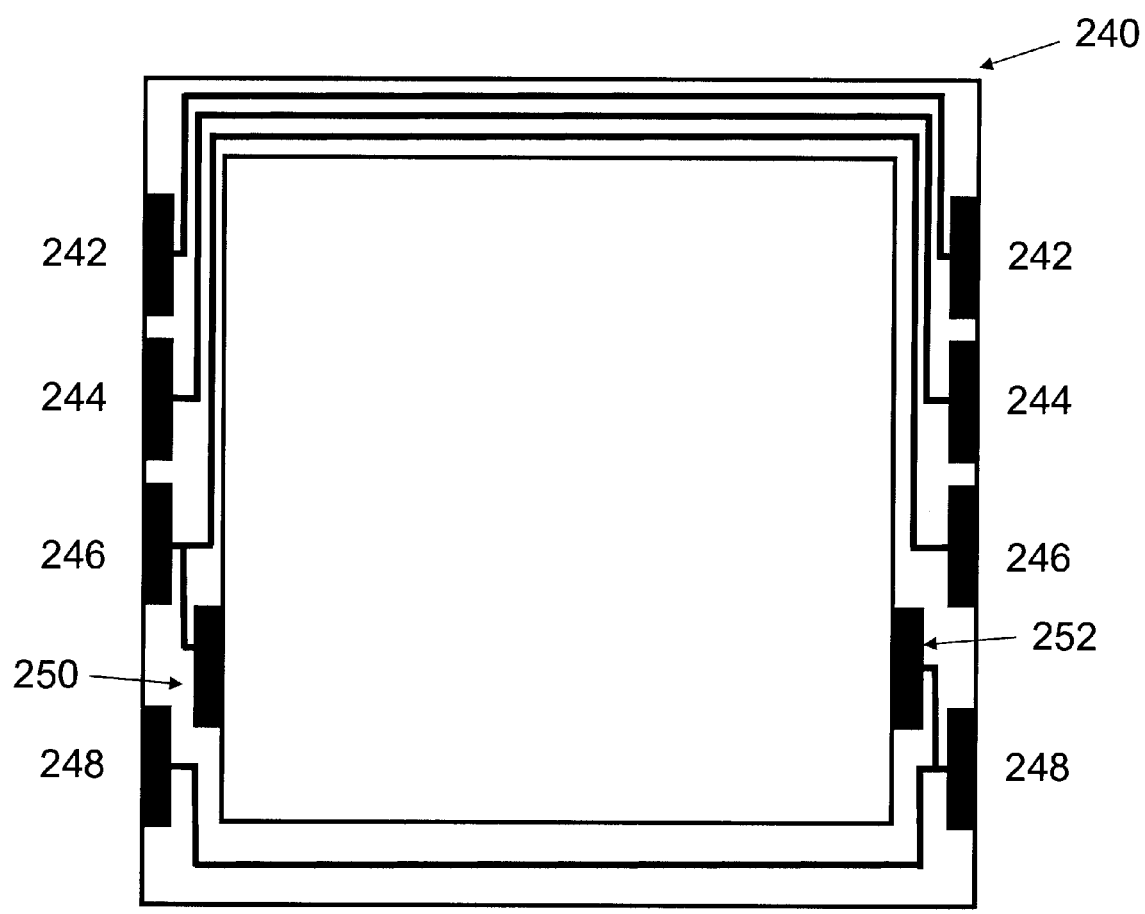
FIG. 2E is a perspective view of an example OLED device compatible with the coupler shown in 2D.

FIG. 2E shows an OLED device 240 that is compatible with couplers that comprise multiple conductive paths. The OLED device 240 has multiple electrodes 242, 244, 246, 248. Two of the electrodes 246 and 248 are used to make contact with the OLED device anode and cathode 250, 252. These electrodes could, for instance, connect with the voltage V3 and ground conductive paths of the coupler. Additional electrodes may also be configured to help drive the OLED device if it comprises multiple emitting areas or layers that can be powered with different driving conditions.

In addition to electrodes 246 and 248, the OLED device may also comprise additional electrodes 242 and 244 that connect to the coupler, but not to the active region of the OLED device. A large number of these additional electrodes could be provided if required by the application. These electrodes can be used to establish a low resistance electrical connection between couplers to which the OLED device is coupled. These electrodes are electrically isolated from the active region of the OLED device and are not used to power the device. These electrodes may, however, be used to supply power to other OLED devices that are connected via couplers and require different driving conditions. This provides a new mechanism to power an array of OLEDs requiring multiple driving conditions. This array of OLEDs can be connected only to each other, possibly through couplers, and not directly to the power supply.

Encapsulation

The OLED device may be already packaged in an encapsulation that protects the organic material of the OLED device from the ambient environment. The resulting OLED device may thus be a standalone device that can be readily installed in a system which does not necessarily provide oxygen and water vapor barriers.

Encapsulation may comprise barrier layers such as single or multi-layer barrier films such as Barix. Methods of coverage may include lamination, vapor deposition, or solution deposition. Furthermore, the encapsulation may comprise a sealant and a barrier structure such as a barrier film or housing. Desiccant materials may be contained within the encapsulation.

Figure 3:
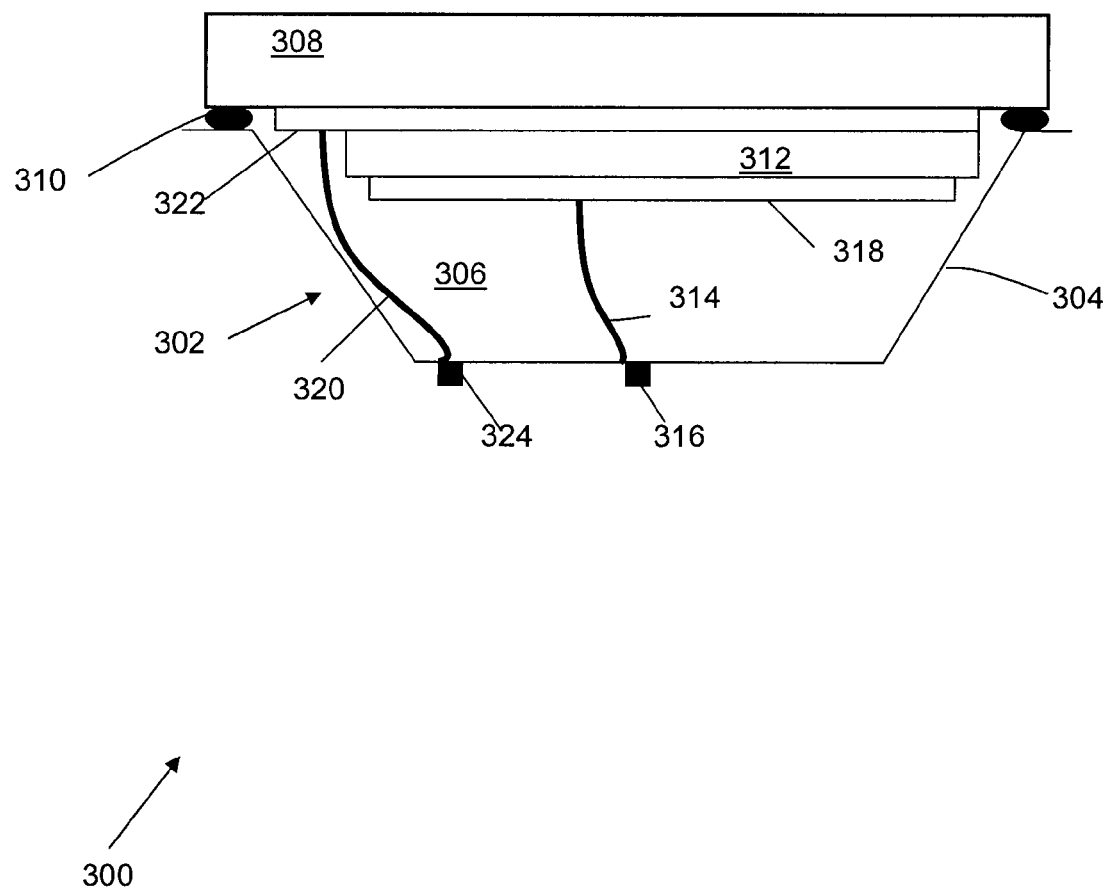
FIG. 3 is a cross-sectional view of an example OLED device packaged in an encapsulation.

An encapsulation 302 of an OLED device 300 is illustrated in FIG. 3. The encapsulation 302 comprises a housing 304 forming an enclosure 306 with the substrate 308. A first sealant 310 is disposed between the housing 304 and the substrate 308, and forms an oxygen and water vapor barrier for the active region 312. The first sealant comprises, for example, mylar coated with metal, or epoxy based adhesives, etc.

The housing may have a first electrically conductive path 314 disposed in a first hermetic seal 316 through the housing 304. The first electrically conductive path 314 may be electrically coupled to the cathode 318.

The housing 304 may further have a second electrically conductive path 320 through the housing 304 via a second hermetic seal 324. The second electrically conductive path 320 may be electrically coupled to the anode 322. In this case, the housing 304 may comprise a non-conductive material.

In another embodiment, the housing 304 may be electrically conductive. For example, the housing 304 may comprise a metal, such as aluminum, or a conductive plastic. In this case, the first electrically conductive path 314 is electrically isolated from the housing 304. Instead of using the second electrically conductive path 320 through the housing 304, the anode 322 may be electrically coupled to the housing 304 through the first sealant 310 which in this case is conductive.

The electrically conductive housing 304 may thus form a common anode with neighboring OLED devices.

Housing

Figure 4:
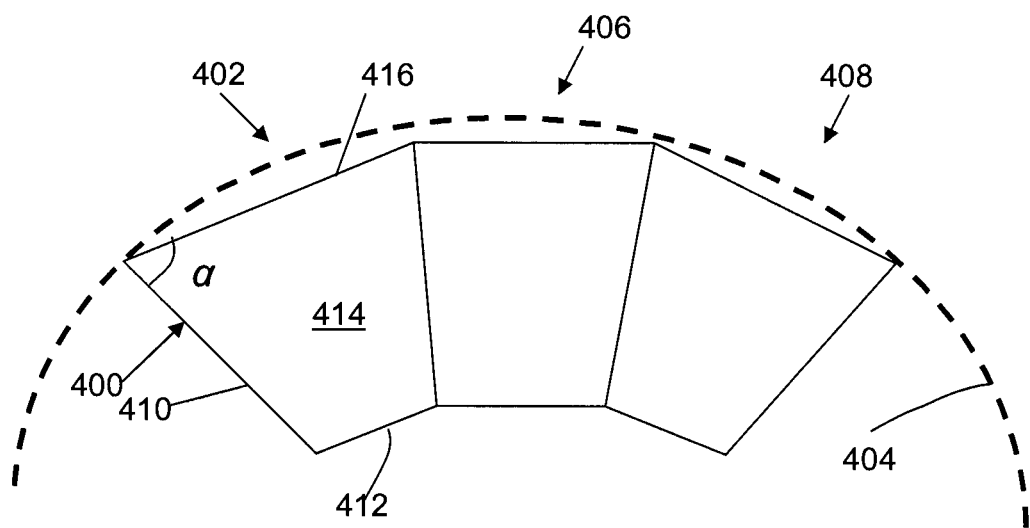
FIG. 4 is a cross-sectional view of a plurality of example packaged OLED devices tightly arranged on a curved surface.

As shown in FIG. 4, the housing 400 has a contoured shape that allows the OLED device 402 to be arranged on a curved surface 404 with a plurality of neighboring OLED devices 406, 408 without causing substantial interference between housings of neighboring OLED devices.

In one embodiment, the housing 400 has a slanted side wall 410 and a bottom wall 412, and wherein a slant angle α of the slanted side wall 410 is selected such that, when the OLED device 402 is tightly arranged with a plurality of neighboring OLED devices 406, 408 on the curved surface 404, housings of neighboring OLED devices do not substantially interfere with each other. For example, when the slant angle α is about 60°, two neighboring OLED devices 402, 406 may be arranged on a curved surface 404 with such a curvature that the OLED devices 402, 406 form an inward angle of about 120°, while the neighboring sidewalls do not exert pressure on each other. In some embodiments, the slant angle α is in the range between about 30° and 90°.

The enclosure 414 formed between the housing 400 and the OLED device substrate 416 may be filled with an inert gas, such as argon, at a pressure higher than an atmospheric pressure. This further helps prevent oxygen and water vapor from entering the enclosure 414. For example, the pressure may be between about 1.05 and 1.5 times the atmospheric pressure. The strength of the housing material and the active region material determines how high the pressure can be. In a preferred embodiment, the pressure is about 1.1 times the atmospheric pressure.

In the top plan view, the housing 400 has a shape configured to improve the fill factor, i.e., the ratio between the light emitting area to the total area, of the OLED device. The shape of the housing 400 in the top plan view may be a circle, an oval, or polygonal. In one exemplary embodiment, the housing may have a substantially hexagon shape in the top plan view as shown in FIG. 5. Thus, the OLED device 500 is configured to be neighboring six other polygonal OLED devices to form a tightly arranged matrix.

The housing 400 may be coated with a color or labeled with a symbol indicative of a light emission color of the active region.

In some embodiments, the housing may comprise transparent plastic to allow light to pass through. The housing may also be made of glass. The glass housing may be manufactured in a certain shape to improve light out coupling.

Sealant in Encapsulation

Figure 6A:
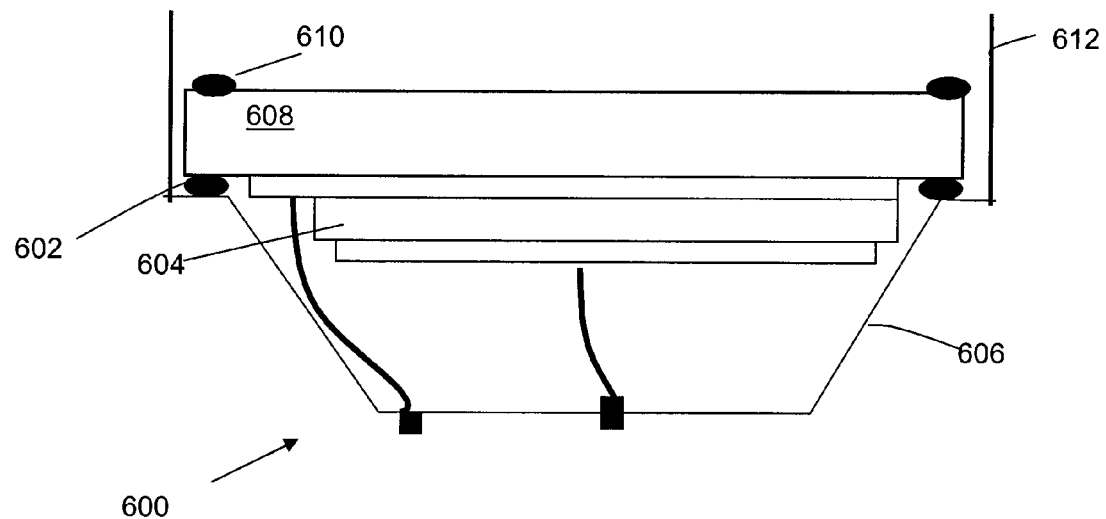
FIGS. 6A and 6B are cross-sectional views of a further sealed example OLED device.
Figure 6B:
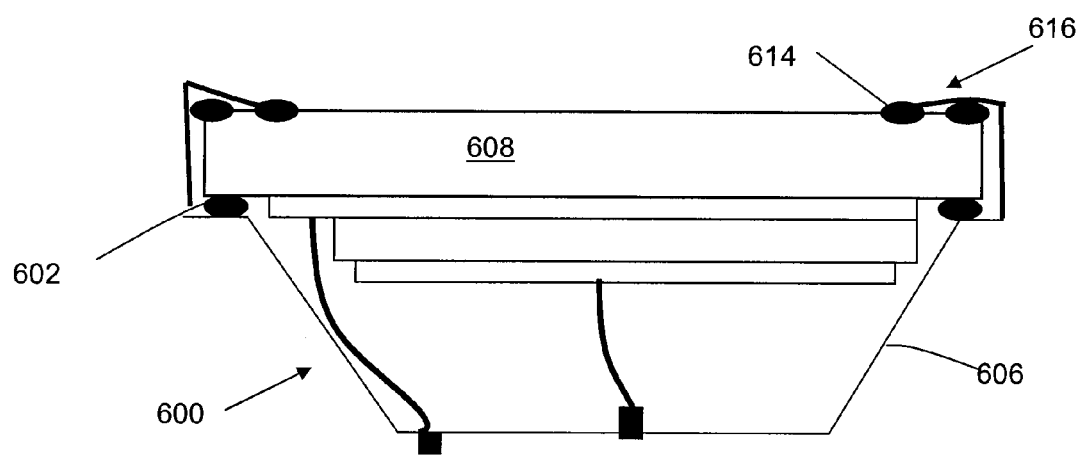

As shown in FIG. 6A, the OLED device 600 has a first sealant 602 configured to form an oxygen and water vapor barrier for the active region 604. The first sealant 602 is disposed between the housing 606 and a first side of the substrate 608. The OLED device 600 may further include a second sealant 610 disposed on a second side of the substrate 608 opposite the first side. An edge portion 612 of the housing 606 may then be bent, forming a "roll crimp" over the second sealant 610, thereby substantially enclosing an edge of the substrate 608. The edge portion 612 of the housing 606 is in contact with the second sealant 610, as illustrated in FIG. 6B, thereby forming the second seal that further prevents oxygen and water vapor from entering the enclosure.

A third sealant 614 may further be applied to seal off a gap between the substrate 608 and the bent portion (roll crimp) 616. The multiple seals improve the sealing of the active region 604, and thus increase its lifespan.

The packaging of the OLED devices may be performed before or after dicing of a large OLED substrate. In the case of before dicing, individual housings may be patterned correspondingly to the individual active regions on the large OLED substrate, and are subsequently sealed, and the individual devices then diced. In the case that the individual OLED regions are already diced from the OLED substrate, both the dices and the housings are patterned correspondingly and then sealed together.

Continuous and Discrete Active Region

Figure 7A:
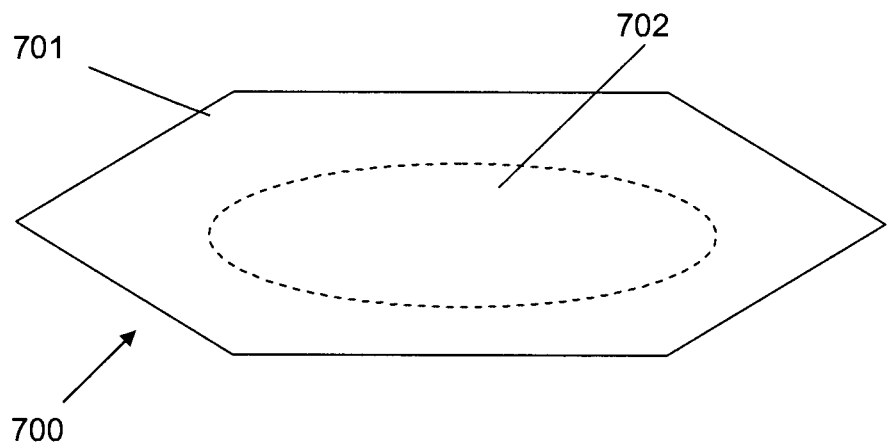
FIG. 7A is a perspective view of an example OLED device with a single, continuous active region.

In the OLED device 700 illustrated in FIG. 7A, as viewed through the transparent substrate 701, the active region 702 is a continuous region forming a single light emitter. Unlike inorganic LEDs which are typically point light sources, the OLED device 700 is an area light source. The active region can be as very large, e.g., on the order of one meter or larger. The size may be limited by manufacturing processes. The active region has a lateral dimension larger than about 0.1 cm. Preferably, the active region has a lateral dimension larger than about 0.5 centimeter. The active region preferably has an area larger than 25 mm².

Figure 7B:
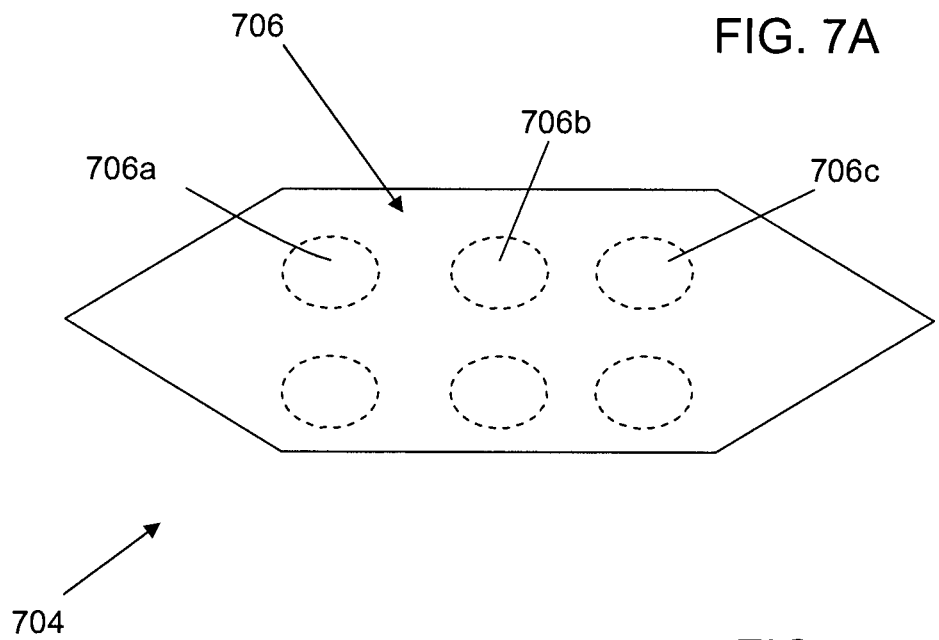
FIG. 7B is a perspective view of an example OLED device with a plurality of active regions.

In another embodiment shown in FIG. 7B, the OLED device 704 has an active region 706 comprising a plurality of discrete light emitters 706a, 706b, 706c, . . . , forming a plurality of pixels. The individual pixels may be collectively driven, e.g., through a common anode and a common cathode, and thus illuminate altogether. Alternatively, these pixels may be individually driven through their own anodes and cathodes. In the latter case, multiple electrical paths and hermetic seals may be needed through the housing and a controller may be used to individually or collectively control the pixels.

Emission Spectrum

Figure 8:
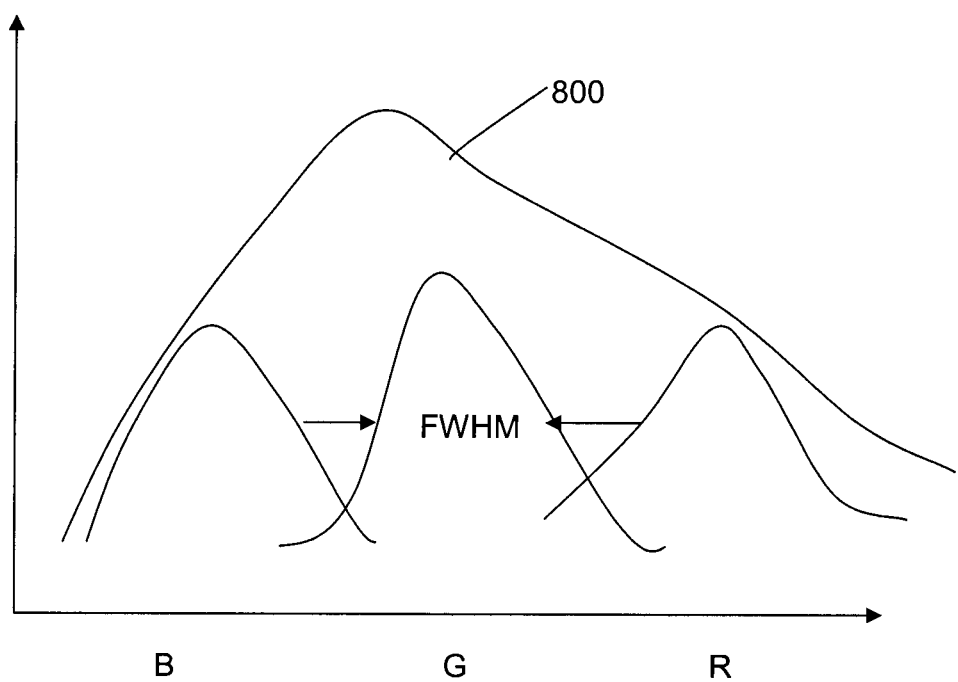
FIG. 8 illustrates example emission spectra of individual OLED devices and their mixed output spectrum.

The active region of the OLED device emits a relatively broad band spectrum. For example, as illustrated in FIG. 8, individual OLED devices may be configured to emit in the blue (B), green (G), or red (R) regime.

The FWHM of the individual spectrum may be larger than 50 nm. Preferably the FWHM is larger than about 100 nm, and may be even larger than about 200 nm in some cases. The broadband emission spectrum may be one selected from a white, a red, a green, a blue, a yellow, an orange, a cyan, or a magenta spectrum. By appropriately mixing different OLED devices, the output spectrum 800 may be visually substantially white.

The broadband emission spectrum 800 corresponds to a color rendering index (CRI) higher than about 60, and preferably higher than about 80, or even higher than about 90. In a preferred embodiment, the broadband emission spectrum corresponds to a CRI of about 100.

Advantageously, the broadband spectra of individual OLED devices are mixed to form the output spectrum 800 which may be very close to naturally white light to human eyes. This is in contrast to conventional lighting systems comprising inorganic LED devices, the spectra of which have a relative narrow band, e.g., on the order of about 10 nm. The resulting mixed light may not be naturally white even when the CRI is high.

The active region of the OLED device may be substantially transparent. The anode may comprise a transparent conductor, for example, ITO. The cathode may comprise one of a metal or a metal alloy, such as aluminum-copper. In some embodiments, the cathode may also comprise a transparent conductor. When mostly transparent layers are used, a plurality of OLED devices may be vertically stacked without blocking light emission from individual devices. In addition, an OLED device may include a plurality of vertically-stacked transparent OLED chips, which are not standalone devices as they may not have their own encapsulations, but may have their own substrates and electrodes and can be individually controlled.

Layers

The early relatively simple devices were not particularly efficient; they emitted few photons relative to the number of charges injected. As the OLED technology evolved, better understanding of the electrode/polymer interfaces has led to the development of new, more advanced and efficient devices.

In particular, hole injection and/or hole transport materials forming a layer between one electrode and the electroluminescent material can improve the efficiency of the device. Thus, hole injection layers (HIL) or hole transport layers (HTL) are often used in OLED structures.

Additional layer and materials technology pertaining to organic electronic devices, including HIL and HTL technology, is described in, for example, U.S. application Ser. No. 11/826,394 filed Jul. 13, 2007 (Sulfonation of conducting polymers and OLED, photovoltaic, and ESD devices), U.S. application Ser. No. 11/496,024 filed Jul. 31, 2006 (Latent Doping of Conducting Polymers), U.S. application Ser. No. 12/113,058 filed Apr. 30, 2008 (Solvent System for Conjugated Polymers), U.S. application Ser. No. 11/350,271 filed Feb. 9, 2006 (Hole Injection Layer Compositions), U.S. application Ser. No. 12/153,181 filed May 14, 2008 (Aryl-substituted conjugated polymers related applications), U.S. provisional application No. 60/960,851 filed Oct. 16, 2007 (Organic Electrodes and Electronic Devices), U.S. provisional application No. 61/029,255 filed Feb. 15, 2008 (Novel Compositions, Methods, and Polymers), U.S. provisional application No. 61/032,905 filed Feb. 29, 2008 (Planarizing Agents and Devices), and U.S. provisional application No. 61/043,654 filed May 13, 2008 (Hole Injection Layer Compositions and Photovoltaic Devices), and are incorporated herein by reference in their entirety.

Figure 9:
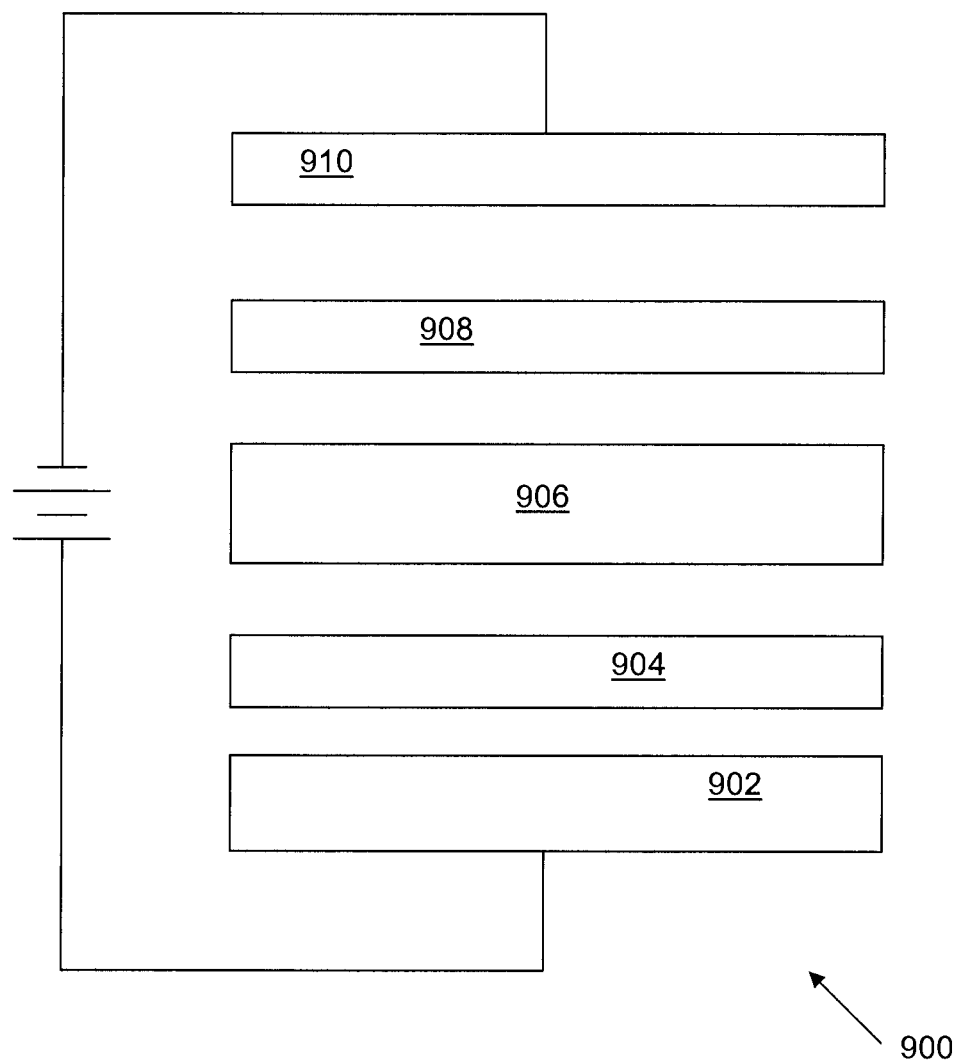
FIG. 9 is a cross-sectional view of an example OLED device with multiple layers that help improve the light emitting efficiency.

More layers may be included in an OLED device to improve the light emitting efficiency. For example, as illustrated in FIG. 9, an OLED device 900 may comprise an anode 902 which includes an ITO layer disposed on glass or polyethylene terephthalate (PET), a hole injection layer 904, an active layer 906, an electron transport layer 908, and a cathode 910. The cathode 910 may comprise Ca, Al, or Ba.

The active region 906 may comprise an electroluminescent polymer disposed as at least one emissive layer, which may be formed by a solution-based process such as ink jet printing, or vapor deposition processes.

The hole injection layer 904 may comprise an inherently conductive polymer. For example, the hole injection layer 904 may comprise a substituted poly-thiophene, a regio-regular substituted poly-thiophene, or a regio-regular substituted poly-3-thiophene. At least one planarizing agent may be included with the polythiophene. The planarizing agent may be selected from, for example, polyvinyl alcohol (PVOH), or derivatives thereof The planarizing agent helps planarizing the interface between layers thereby facilitating the transfer of holes across the interface. The planarizing agent can also help to reduce the optical absorbance, thereby increasing the light output efficiency.

The hole injection layer 904 may also be formed by a solution based process, or by vapor deposition processes. For example, the hole injection layer 904 may be formed by spin casting, drop casting, dip-coating, spray-coating, or by printing methods such as ink jet printing, off-set printing, or by a transfer process. For example, ink jet printing is described in U.S. Pat. No. 6,682,175 to Otsuka, and in Hebner et al., *Applied Physics Letters,* 72, no. 5, Feb. 2, 1998, pages 519-521, the disclosures of which are hereby incorporated by reference in their entirety.

The hole injection layer 904 can be provided that is about 10 nm to about 50 µm in thickness with typical thickness ranging from about 50 nm to about 1 µm. In another embodiment, thickness can be about 10 nm to about 500 nm, and more particularly, about 10 nm to about 100 nm.

Similarly, the electron transport layer 908 may be formed by a solution-based process, or by vapor deposition processes.

Other layers, such as an electron injecting layer, a hole blocking layer, or an electron blocking layer may also be included. The resulting OLED device would comprise an anode, a hole injection layer, a hole transport layer, an electron blocking layer, an active region such as one or more light emitting layers, a hole blocking layer, an electron transport layer, an electron injection layer, and a cathode. The hole transport layer and the electron transport layer facilitate transportation of electrons and holes, respectively, into the active region, while the electron and hole blocking layers prevent electrons or holes leaving the active region.

Examples for materials used for the different layers include:

1) Hole Injection Layer: PEDOT (poly(3,4-ethylenedioxythiophene)):PSS (polystyrenesulfonic acid), Plexcore OC, LG101 (Hexaazatriphenylene hexanitrile), MeO-TPD ([1,1'-Biphenyl]-4,4'-diamine, N4,N4'-bis(4-methoxyphenyl)-N4,N4'-diphenyl-benzidine):F4TCNQ (N4,N4'-diphenyl-benzidine);
2) Electron Injection Layer: Li (lithium), Ca (Calcium), Ba (Barium), LiF (Lithium Fluoride), CsCO3 (Cesium Carbonate), Ca(acac) (calcium acetylacetonate), Li:BPhen (Lithium:Bathophenanthroline(4,7-Diphenyl-1,10-phenanthroline)), Cs:BPhen (Cesium:Bathophenanthroline(4,7-Diphenyl-1,10-phenanthroline));
3) Hole Transport Layer: TPD, NPB (1,4-bis(1-naphthylphenylamino)biphenyl), Polymeric versions of TPD or other benzidines, PFO (poly(fluorene-oxadiazole)), TFB (poly (2,7-(9,9-di-n-octyfluorene)-(1,4-phenylene-((4-secbutylphenyl)imino)--1,4-phenylene))), PPV (poly(1,4-phenylene vinylene);
4) Electron Transport Layer: Alq3 (Tris-(8-hydroxyquinolino)aluminum), Lithium quinoline, OXD-7 (2,2'-(1,3-Phenylene)bis[5-[4-(1,1-dimethylethyl)phenyl]]-1,3,4-Oxadiazole), TAZ (3,5-Bis(4-tert-butyl-phenyl)-4-phenyl-triazole);
5) Hole Blocking Layer: BCP (2,9-dimethyl-4,7-diphenyl-1, 10-phenanthroline), BPhen, OXD-7, TAZ;
6) Electron Blocking Layer: TCTA (4,4',4"-Tris(carbazol-9-yl)-triphenylamine), Spiro-TAD (2,2',7,7'-Tetrakis(n,n-diphenylamino)-9,9'-spirobifluorene); and
7) Light emitting layer: Polyfluorene family, PPV family, co-deposited small molecule films such as Ir(ppy)3 (Tris [2-(2-pyridinyl)phenyl-C,N]-iridium (III)) in CBP (4,4'-Bis(carbazol-9-yl)-biphenyl).

Stacked Light Emitting Layers

Figure 10:
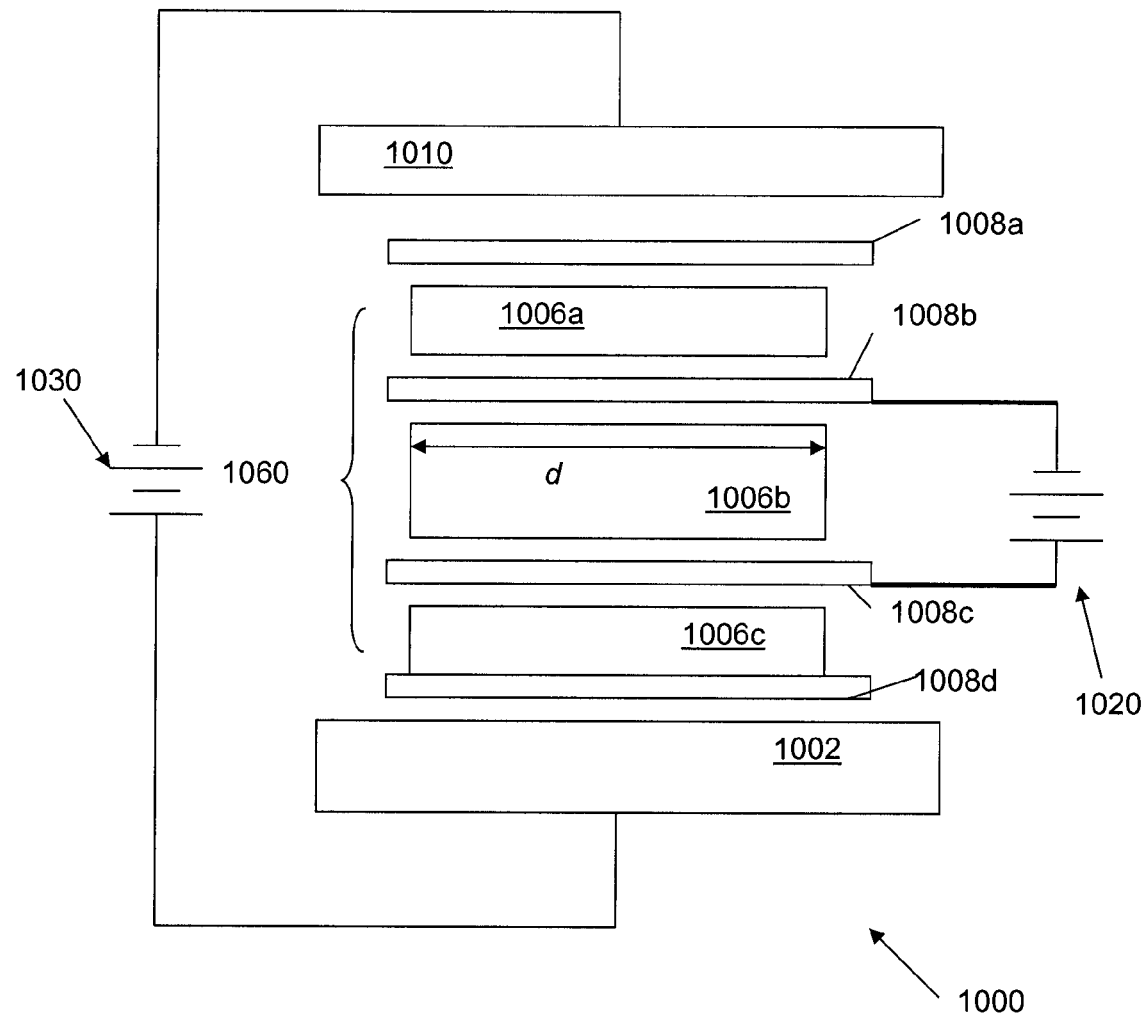
FIG. 10 is a cross-sectional view of an example OLED device with multiple active layers.

In an embodiment shown in FIG. 10, an OLED device 1000 has an active region comprising a plurality of vertically-stacked light emitting layers 1006a, 1006b, 1006c. At least two of the light emitting layers are configured to emit light of different colors. The plurality of vertically-stacked light emitting layers 1006a, 1006b, 1006c may be interlaced with substantially transparent non-emitting layers 1008a, 1008b, 1008c, 1008d.

The substantially transparent non-emitting layers 1008b, 1008c may be electrodes for one of the light emitting layers 1006b so that the light emitting layers 1006b may be independently controlled using a power supply 1020 that is different from the power supply 1030 for the OLED device 1000. Those of ordinary skill in the art will recognize that instead of using different power supplies 1020, 1030, a single power supply can be used that is coupled to a controller, and the controller individually addresses and controls the different light emitting layers. In the configuration shown in FIG. 10, an electrical path may be configured from the anode 1002 to the cathode 1010 while bypassing the electrodes 1008b, 1008c and the light emitting layer 1006b.

The cathode 1010 may be disposed on a transparent substrate. The cathode 1010 and the anode 1002 may also be substantially transparent such that the OLED device 1000 is configured to emit light in both the cathode and the anode directions. A transparent material selected from a conductive oxide, a metal thin film, or an organic thin film may be used for the transparent cathode or anode.

In some embodiments, at least one of the anode 1002 or the cathode 1010 comprises a reflective material, and the OLED device 1000 is configured to be an edge emitting OLED device. The reflective layers, which may be coated layers, or layers with selected refractive indices to cause a total internal reflection, may form a waveguide for the emitted light. The edge emitting OLED device can use non-transparent layers without blocking light in a stacked configuration.

The lateral dimension d of the active region as shown is larger than about 0.5 centimeter. Thus, this OLED device 1000 advantageously is an area light source, unlike conventional inorganic LED devices which are typically point light sources. The lateral dimension d can be as large as possible, but may be limited by manufacturing processes. Typically d is smaller than about 1 meter. Preferably, d is less than a characteristic distance for charge transport, e.g., the distance charges can travel, in the anode 1002. When the anode 1002 comprises ITO, d is preferably less than about 10 cm.

Figure 11:
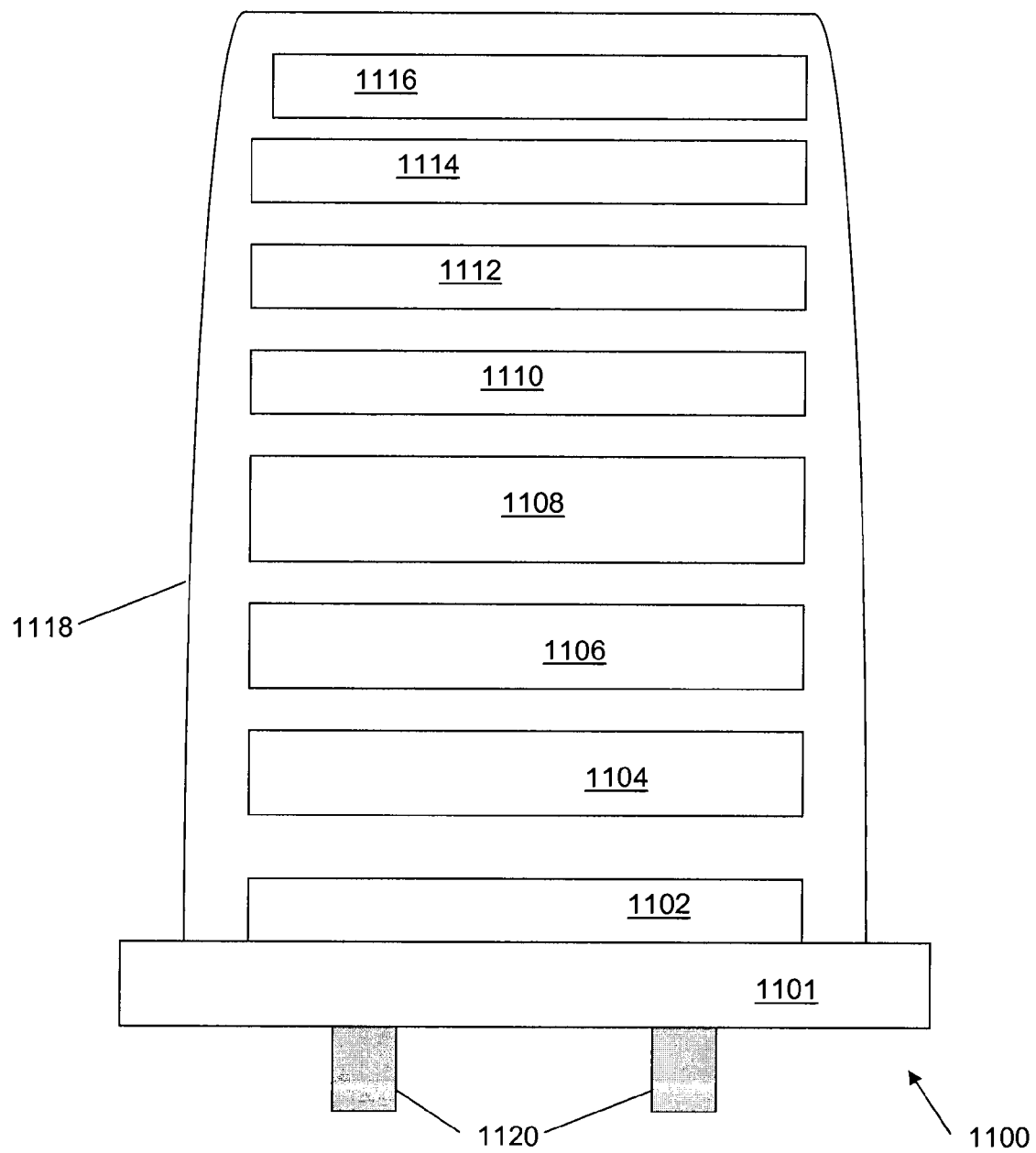
FIG. 11 is a cross-sectional view of an example of a vertically stacked OLED device structure.

Other stacked configurations of OLED devices are possible. As illustrated in FIG. 11, an OLED device 1100 comprises a substrate 1101, a first anode 1102, an HIL 1104, a first light emitting layer 1106, a first cathode 1108, a second anode 1110, a second light emitting layer 1112, an electron transport layer 1114, and a second cathode 1116. The first light emitting layer 1106 is electrically coupled to the first anode 1102 and the first cathode 1108. The second light emitting layer 1112 is electrically coupled to the second anode 1110 and the second cathode 1116. The first and second emitting layers 1106, 1112 may be electrically coupled in series to a single power supply. Alternatively, the first and second emitting layers 1106, 1112 may be individually controlled and/or addressed.

An encapsulation 1118 may be used to isolate the first and second light emitting layers 1106, 1112 from the ambient environment. One or more couplers 1120 may be configured to electrically couple at least one of the first anode, the second anode, the first cathode, or the second cathode to a power supply. Each of the first or second light emitting layers 1106, 1112 comprises an organic material and is configured to emit a broadband emission spectrum with a FWHM larger than about 50 nm. The first and second light emitting layers 1106, 1112 may be of the same color, or have different colors.

Light Out-Coupling

Figure 12A:
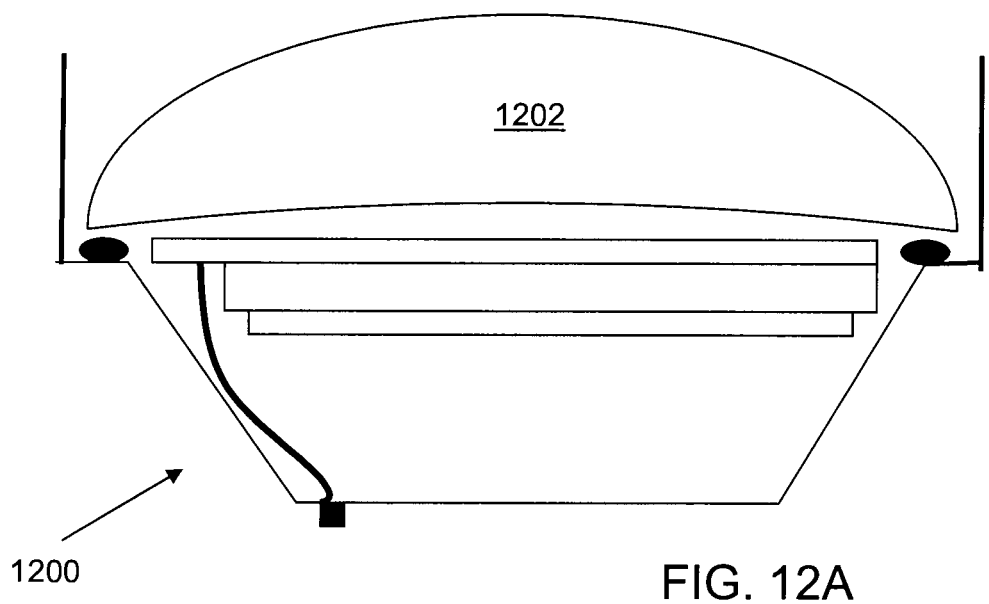
FIGS. 12A and 12B are cross-sectional views of example OLED devices having light-out coupling layers to improve light output efficiency.
Figure 12B:
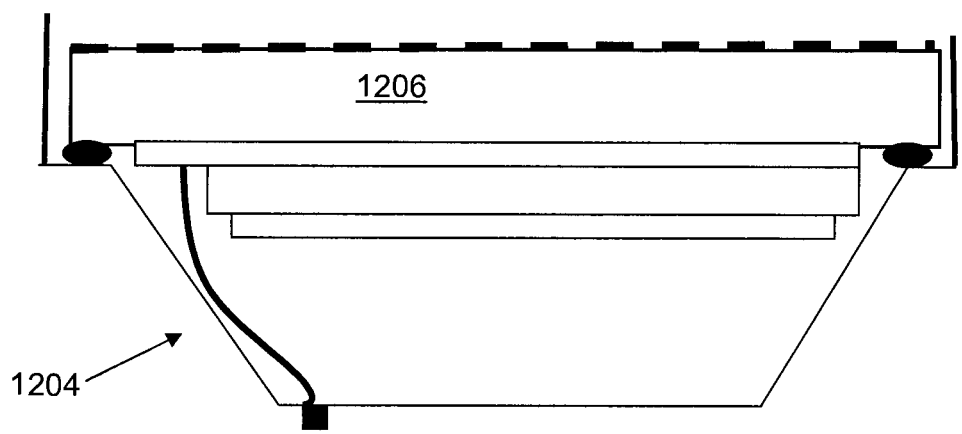

In addition to including layers such as HIL to improve the light emitting efficiency, the OLED device may have an improved light emitting efficiency by improving the light out-coupling efficiency by engineering the optics. In some embodiments, the OLED device includes a light coupling layer configured to improve light out-coupling. For example, as illustrated in FIG. 12A, the OLED device 1200 has a substrate 1202 with a lens-shaped surface. As shown in FIG. 12B, the OLED device 1204 has a substrate 1206 with a patterned surface. The patterned surface forms a grating that improves the light out-coupling efficiency and directability. Alternatively, the light coupling layer may comprise a plurality of microlenses, a photonic crystal, a roughened transparent surface, or a low refractive index layer. The low refractive index layer may comprise, for example, an aerogel. The low refractive index layer may reduce the internal reflection in the vertically emitting configuration. A combination of light out-coupling techniques may be used. For example, the substrate may have a patterned surface such as a grid etched in a glass substrate that is used to refract trapped light through the glass and into a layer of micro-lenses.

In some embodiments, the light out-coupling layer is also configured to convert the spectrum emitted by the active region to another spectrum of a longer wavelength. For example, the light coupling layer may comprise a phosphor layer, or a quantum-dot-based film. The phosphor layer or the quantum-dot-based film can be configured for down-converting photons of higher energy to lower energy.

OLED Lighting Kit

The OLED structure illustrated in FIG. 1, as well as other basic OLED structures, can be applied to a modular design of OLED devices for lighting. In particular, a plurality of pre-manufactured modular OLED devices may be provided, and the individual modular OLED devices can be selected and "plugged" into a system mount, thereby forming a configurable lighting system. The system can have desired optical properties, such as the color, by selecting an appropriate set of OLED devices to couple to the mount.

The pre-manufactured OLED devices such as that illustrated in FIG. 1 can be provided in a lighting kit. The lighting kit can include at least two types of pre-manufactured, modular OLED devices of different colors, each OLED device comprising a substrate, an anode, a cathode, and an active region comprising an organic material.

In addition to different colors, OLED devices with different sizes, ranging from 0.1 cm to 1 m, and different shapes such as circular or polygonal, may be provided. The OLED devices may already have couplers attached thereto, and thus are "plug and play" devices.

The lighting kit may further comprise a power supply, a mount for receiving at least one of the plurality of OLED devices, and a plurality of conductive couplers. The conductive couplers may be attached to the OLED devices already, or may be provided separately. Each of the plurality of conductive couplers has at least one conductive surface area and at least one insulating surface area at predetermined locations for electrically coupling one of the OLED devices with another OLED device, or with the mount.

The lighting kit may further comprise a homogenizer to reduce the pixilated appearance of an OLED array.

The lighting kit can further include instructional materials, including how to assemble and use the components, and the component specifications, as described throughout this disclosure.

OLED Device Assembled From the Lighting Kit

A customer, such as a consumer electronics manufacturer or a consumer, may select a subset of OLED devices from the lighting kit, and assemble a lighting or signage apparatus with appropriate selection of OLED devices having different colors and brightness.

Figure 13:
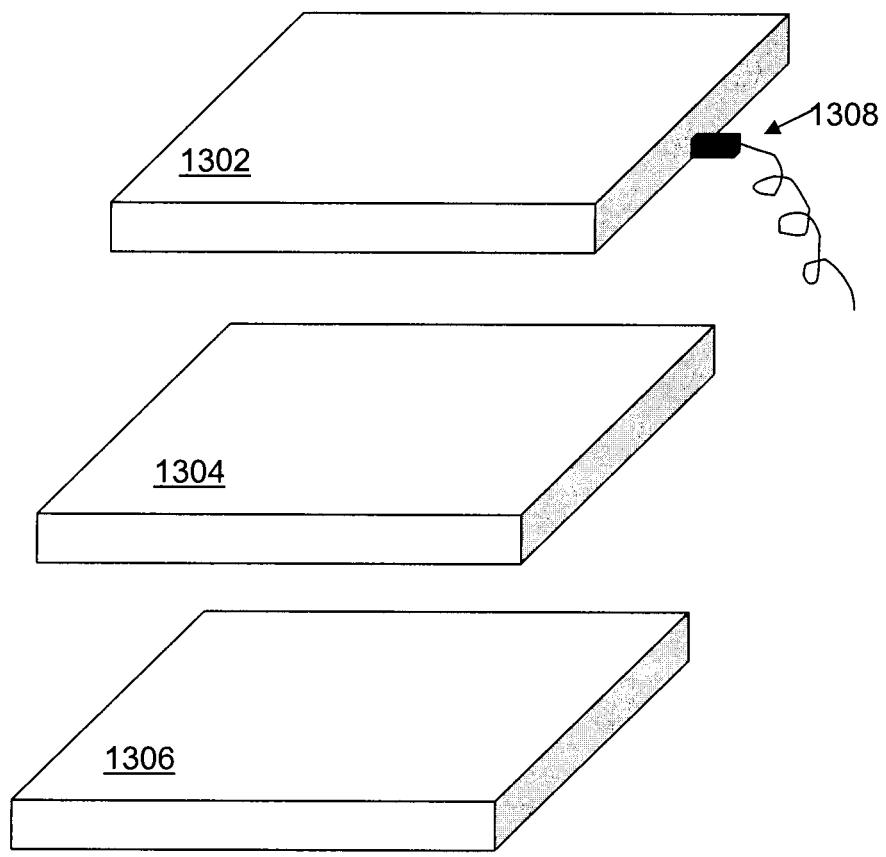
FIG. 13 is a perspective view of an example of a stacked OLED device assembled from a lighting kit of pre-manufactured, modular OLED devices.

For example, in FIG. 13, a stacked OLED configuration is shown, where a plurality of OLED devices 1302, 1304, 1306 are stacked vertically. One or more electrodes 1308 may be arranged on the side, and the individual OLEDs may have transparent substrates such as in transparent glass-on-glass configuration. The stacked OLED structure increases the total light output per unit area, while the individual OLED devices may be driven at a relatively low current, thereby increasing their lifespan.

Alternative to using the glass-on-glass structure, light may be coupled out from the edges of the stack, for example, using gratings and waveguides.

Vertical Coupling of Stacked OLED Devices

Figure 14A:
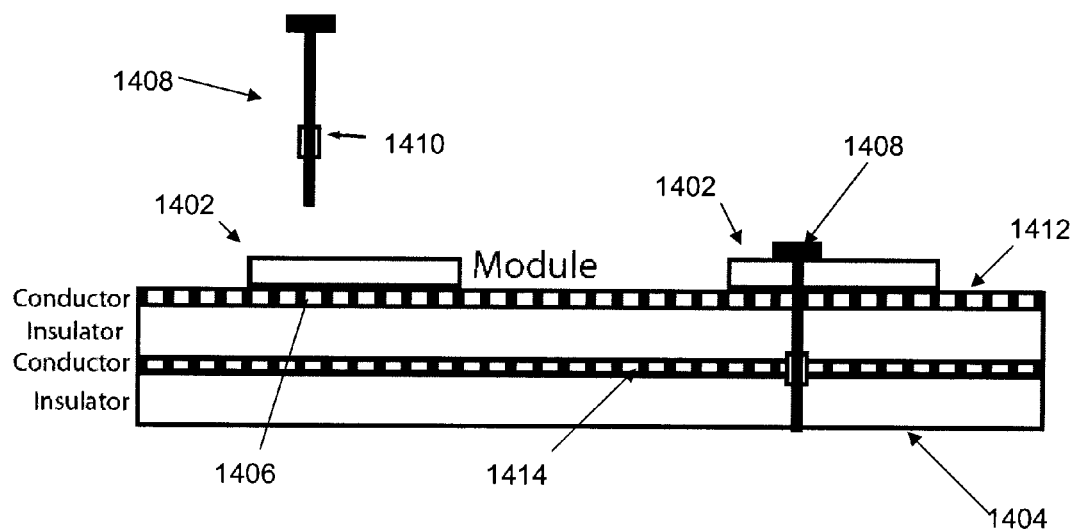
FIGS. 14A-14C are cross-sectional views of example elongated conductors used in forming a stacked OLED device.

A method of coupling an OLED device vertically with another OLED device, or with a mount, is illustrated in FIG. 14A. The OLED device 1402 and the mount 1404 have pre-fabricated via holes 1406, in which elongated conductors 1408 may be fit in. The via holes 1406 may be etched or machined, depending on the substrate material of the OLED device 1402 or the mount 1404.

The elongated conductors 1408 have patterned outer surface areas with insulating regions 1410 and conductive regions at desired locations such that, when fitted into the via holes 1406, proper electrical paths and insulations among the vertical layers may be formed. The elongated conductors 1408 may be fit into the via holes 1406 by "stapling," or by threaded engaging. The elongated conductor 1408 may be flexible to accommodate a flexible system. The elongated conductor is configured to both mechanically and electrically couple one of the OLED devices 1402 with another one of the OLED devices or with the mount 1404.

In the mount 1404 shown in FIG. 14A, two conductive layers 1412 and 1414 are included. When the elongated conductor 1408 is coupled to the mount 1404 and the OLED device 1402, the insulating region 1410 comes into contact with the second conductive layer 1414. Accordingly, an electrical connection is established between the first conductive layer 1412 and the OLED device 1402 through the elongated conductor 1408. By prearranging the locations of the insulating regions and the conductive layers, complex electrical connections may be established.

Figure 14B:
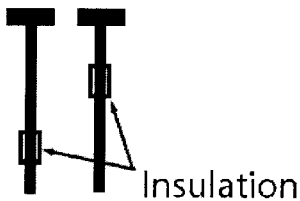
Figure 14B:
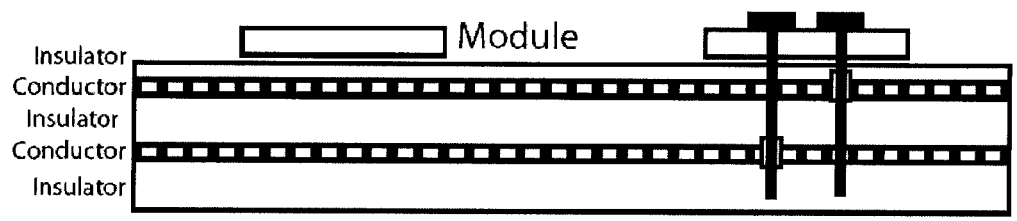

In another example shown in FIG. 14B, two elongated conductors are included each having insulating regions located at different locations. These locations may correspond to the depth of the two conductive layers. As shown, once both elongated conductors are coupled to the OLED device and the mount, two electrodes of the OLED device may be coupled to the first and second conductive layers, respectively.

Figure 14C:
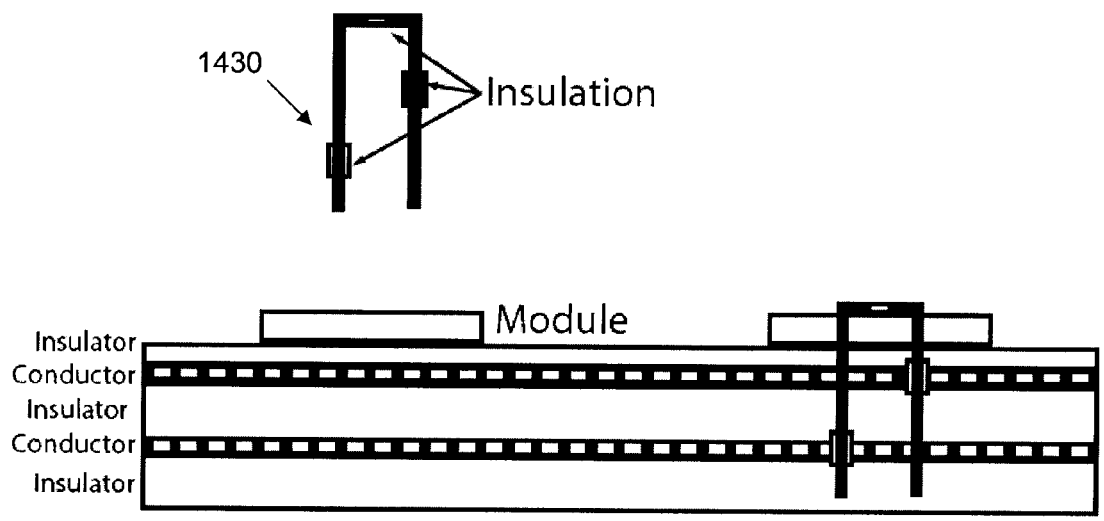

Further, in an embodiment shown in FIG. 14C, an integrated connector 1430 may be used. The integrated connector 1430 has a substantially "U" shape with two "arms" and resembles a stable. Insulating regions are disposed at different locations of the integrated connector 1430. Those of ordinary skill in the art will recognize that connectors of other shapes with more "arms" are possible.

Figure 14D:
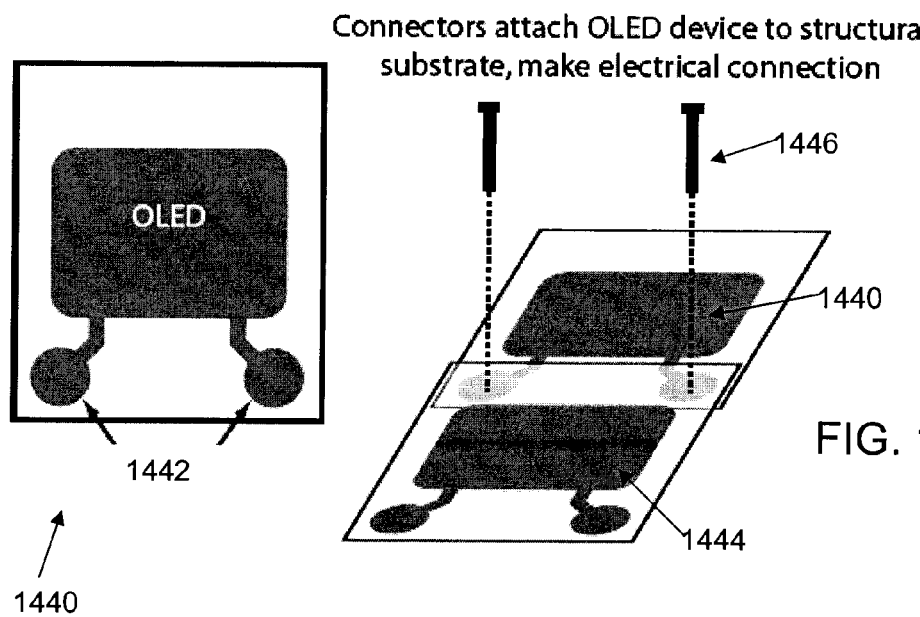
FIG. 14D is a schematic diagram illustrating a plurality of example OLED devices being coupled using elongated conductors.

As shown in FIG. 14D, an example OLED device 1440 has one or more contact pads 1442. The OLED device 1440 can be coupled to a mount, or to another OLED device 1444, using elongated conductors 1446 that may be "stapled" through the contact pads 1442.

The modular OLED devices, which are pre-manufactured and may be already packaged, may be "plugged in" or "dropped in" to a mount and arranged in a pattern. Advantageously as a result of the modular design, the individual OLED devices may be selected from a lighting kit comprising devices with different color characteristics, sizes, and shapes.

In one embodiment, the modular OLED devices are selected and dropped in on the mount in a ratio based on their expected lifespan. For example, a two-to-one ratio between the number of blue OLEDs and the number of red OLEDs may be predetermined based on that the lifespan of the blue OLED is about half that of the red OLED.

In one example, more blue OLED devices, which typically have shorter life spans, are included in the lighting system, as compared with red or green OLED devices. For example, for every red or green OLED, two (2) blue OLED devices may be included. The two blue OLED devices may be alternately activated as controlled by a controller.

In a "low cost" approach, all the OLED devices may be simply driven by a same voltage and the blue OLEDs may be configured to have higher resistance and thus lower current. This also would improve the lifespan of the blue OLED devices, while the increased number of these blue OLED devices compensates for the lower activation levels to realize the desired luminance and color characteristics.

During the wearing/aging of the lighting system, the color and other optical characteristics are thus effectively controlled by the selection of the OLED devices.

An Exemplary Embodiment

Figure 15:
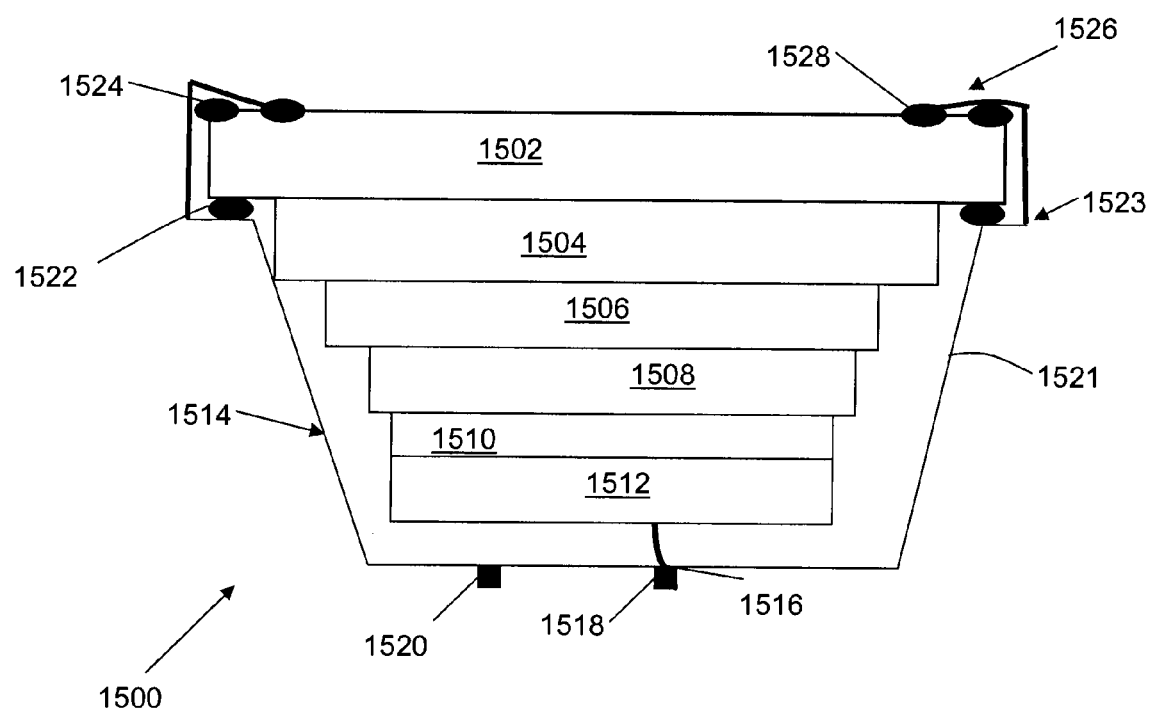
FIG. 15 is a cross-sectional view of an example of a pre-manufactured, modular OLED device.

A prophetic example of a pre-manufactured modular OLED device 1500 is illustrated in FIG. 15. The geometrical shapes and sizes are exaggerated for clarity, and are not drawn to scale. The OLED device 1500 as shown has a lateral dimension of about 1 cm, and has a hexagonal shape in a top plan view as in FIG. 5. When provided in a lighting kit, multiple OLED devices are provided with different sizes, colors, and shapes. The glass substrate 1502 is about 1 mm thick. Disposed on the glass substrate 1502 is a layer of ITO 1504 as the anode, which is about 100 nm thick. A hole injection layer 1506, comprising an inherently conductive polymer, is adjacent the anode and is about 200 nm thick. The active region 1508 comprises poly-phenylene vinylene, and is about 300 nm thick.

A condition layer 1510 comprising LiF, which may be only a few angstroms thick, is disposed between the active region 1508 and the cathode 1512 to improve the coupling between the active region 1508 and the cathode 1512. The cathode 1512 comprises an aluminum layer with a thickness of about 100 nm.

The above layers are enclosed in the housing 1514. The cathode 1512 is electrically coupled, through a hermetic seal 1516 on the housing 1514, to a first coupler 1518. The housing 1514 in this embodiment is composed of aluminum, and is electrically coupled to the anode 1504. A second coupler 1520 is attached to the housing 1514, and thus is electrically coupled to the anode 1504. The OLED device 1500 can thus be readily plugged into corresponding couplers (indentations) on a mount or another OLED device.

In this prophetic example wherein the housing 1514 is composed of aluminum, the housing 1514 is shaped from aluminum flatstock to have a thickness, composition and temper to permit single or multi-stage stamping or drawing that results in a "pan" of the desired geometric configuration to accommodate the installation of the OLED devices. The configuration of the pan is made to conform to the OLED device 1500 in such a way that the installed device rests on a lip 1523 formed into the sidewall 1521 of the pan and is of uniform dimension around the circumference of the pan. This lip 1523 serves as the first surface to which sealant/adhesive 1522 is applied to affect the hermitic encapsulation of the OLED device. The described sidewall 1521 shall be of a height to extend above the installed OLED device by not less than the thickness of the OLED substrate to four (4) times the thickness of the OLED substrate.

To the installed and sealed OLED device a continuous bead of a second sealant 1524 of the same or of a different composition than the first sealant 1522 is applied to the external surface of the OLED device 1500 in proximity to the edge of the device and completely around the circumference of the OLED device 1500. After application of the second sealant 1524, the sidewall 1521 is "rolled" or "ironed" over the bead of second sealant 1524 to form a "lock" 1526 whereby the second sealant 1524 is captured beneath the "lock" 1526 and thereby retains the OLED layers in the "pan." A third sealant 1528 further seals the lock 1526. The objective of such a configuration and material combination is to form a torturous path to resist the migration of water and oxygen to the inside of the OLED device enclosure.

As shown the aluminum housing ("pan") 1514 is further modified to include one or two hermitically sealed electrical contacts 1518, 1520 on the bottom side of the housing 1514 such that the required electrical power for the OLED device can be delivered without jeopardizing the hermitic seals. In the case where there is only one electrical contact, the contact may carry the positive charge (+) to the active region 1508, and the "pan" itself provides the negative (−) path through contact with other "pans" and eventually to the power supply. Alternatively, the "pan" may be used as a common anode while the contact 1518 through the hermetic seal 1516 may be coupled to the cathode 1512 as shown in FIG. 15.

Further Embodiments

Additional embodiments are provided in U.S. priority provisional application 61/090,150 filed Aug. 19, 2009 which is hereby incorporated by reference in its entirety.

In one aspect, an OLED device is provided. The OLED device includes a substrate, an anode, a cathode, an active region comprising an organic material, wherein the active region is electrically coupled to the anode and the cathode and is configured to emit a broadband emission spectrum with a FWHM larger than about 50 nm, at least one coupler configured to electrically couple at least one of the anode or the cathode to a power supply, and an encapsulation that isolates the active region from an ambient environment.

In another aspect, an OLED device is provided, which includes a substrate, an anode, a cathode, and an active region comprising an organic material, wherein the active region is electrically coupled to the anode and the cathode and is configured to emit a broadband emission spectrum with a FWHM larger than about 50 nm, at least one coupler configured to electrically couple at least one of the anode or the cathode to a power supply, and an encapsulation that isolates the active region from an ambient environment, wherein the active region comprises a plurality of vertically-stacked light emitting layers.

The active region can include a plurality of vertically-stacked light emitting layers. The light emitting layers may be interlaced with multiple electrodes such that the light emitting layers may be individually addressed and controlled.

In another aspect, an OLED device is provided, which includes a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, and wherein the first and second light emitting layers are electrically coupled to their respective anodes and cathodes.

In another aspect, a kit of pre-manufactured modular OLED devices is provided. The OLED devices include at least two types of OLED devices of different colors, each OLED device including a substrate, an anode, a cathode, and an active region including an organic material, wherein the active region is electrically coupled to the anode and the cathode and is configured to emit a broadband emission spectrum with a FWHM larger than about 50 nm, at least one coupler configured to electrically couple at least one of the anode or the cathode to a power supply, and an encapsulation that isolates the active region from an ambient environment.

In another aspect, a method of manufacturing an OLED device is provided. The method includes providing a substrate, an anode, a cathode, and an active region comprising an organic material, and a housing, wherein the active region is electrically coupled to the anode and the cathode and is configured to emit a broadband emission spectrum with a FWHM larger than about 50 nm, and assembling the substrate, the anode, the cathode, the active region and the housing to form the OLED device.

In another aspect, an OLED device is provided, which includes a substrate, an anode, a cathode, an active region comprising an organic material, wherein the active region is electrically coupled to the anode and the cathode, at least one coupler, and an encapsulation that isolates the active region from an ambient environment.

In another aspect, a lighting system is provided. The lighting system includes a plurality of OLED devices, wherein each of the OLED devices includes a substrate, an anode, a cathode, an active region comprising an organic material, wherein the active region is electrically coupled to the anode and the cathode, at least one coupler configured to electrically couple at least one of the anode or the cathode to a power supply, and an encapsulation that isolates the active region from an ambient environment.

At least one advantage from at least one embodiment is that the OLED device is a "plug and play" device and can be readily placed into a system and/or replace an existing device. The encapsulation and the coupler allow the OLED device to be a standalone device.

At least another advantage from at least one embodiment is the large area light emitting source as a result of using organic materials. The ease of manufacturing and the tunable color with the desirable visual effect are provided by the organic material.

In at least some of the embodiments, an OLED device is provided. The OLED device comprises a substrate, an anode, a cathode, an active region comprising an organic material, wherein the active region is electrically coupled to the anode and the cathode and is configured to emit a broadband emission spectrum with a FWHM larger than about 50 nm, at least one coupler configured to electrically couple at least one of the anode or the cathode to a power supply, and an encapsulation that isolates the active region from an ambient environment.

In one aspect, the OLED device coupler is configured to electrically couple at least one of the anode or the cathode with the power supply via a mount.

In another aspect, the OLED device coupler is configured to electrically couple at least one of the anode or the cathode with the power supply via a second OLED device.

In one aspect, the OLED device coupler may be configured to mechanically couple the OLED device with a mount or with a second OLED device.

In one aspect, the OLED device coupler comprises a protrusion configured to be snapped into an indentation on a mount or a second OLED device.

In another aspect, the OLED device coupler comprises an indentation for a protrusion of a mount or a second device to snap therein.

In one embodiment, the OLED device encapsulation comprises a housing forming an enclosure with the substrate and a first sealant configured to form an oxygen and water vapor barrier for the active region.

In another aspect, the OLED device encapsulation comprises a housing forming an enclosure with the substrate and a first sealant configured to form an oxygen and water vapor barrier for the active region wherein the housing comprises a first electrically conductive path disposed in a first hermetic seal through the housing, and this first electrically conductive path is electrically coupled to the cathode.

In one embodiment, the OLED device encapsulation comprises a housing forming an enclosure with the substrate and a first sealant configured to form an oxygen and water vapor barrier for the active region, wherein the housing has a first electrically conductive path in a first hermetic seal through the housing, and wherein the first electrically conductive path is electrically coupled to the cathode, wherein the housing further has a second electrically conductive path through the housing, and wherein the second electrically conductive path is electrically coupled to the anode.

In another aspect, the OLED device encapsulation comprises a housing forming an enclosure with the substrate and a first sealant configured to form an oxygen and water vapor barrier for the active region, wherein the housing has a first electrically conductive path in a first hermetic seal through the housing, and wherein the first electrically conductive path is electrically coupled to the cathode, wherein the housing further has a second electrically conductive path through the housing, and wherein the second electrically conductive path is electrically coupled to the anode, wherein the second electrically conductive path is through a second hermetic seal.

In another embodiment, the OLED device encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing.

In another aspect, the OLED device encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the electrically conductive housing forms a common anode with neighboring OLED devices.

In another aspect, the OLED device encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the housing has a contoured shape that allows the OLED device to be arranged on a curved surface with a plurality of neighboring OLED devices without causing substantial interference between housings of neighboring OLED devices.

In another aspect, the OLED device encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the housing has a contoured shape that allows the OLED device to be arranged on a curved surface with a plurality of neighboring OLED devices without causing substantial interference between housings of neighboring OLED devices, wherein the housing has a slanted side wall and a bottom wall, and wherein a slant angle of the slanted side wall is selected such that, when the OLED device is tightly arranged with a plurality of neighboring OLED devices on a curved surface, housings of neighboring OLED devices do not substantially interfere with each other.

In one aspect, the OLED device encapsulation comprises a substantially polygonal housing forming an enclosure with the substrate.

In another aspect, the OLED device encapsulation comprises a substantially hexagonal housing forming an enclosure with the substrate.

In one aspect, the OLED device encapsulation comprises a housing forming an enclosure with the substrate and a first sealant configured to form an oxygen and water vapor barrier for the active region, wherein the enclosure is filled with an inert gas at a pressure equal to or higher than an atmospheric pressure.

In one aspect, the OLED device encapsulation comprises a housing forming an enclosure with the substrate and a first sealant configured to form an oxygen and water vapor barrier for the active region, wherein the enclosure is filled with an inert gas at a pressure higher than an atmospheric pressure, wherein the pressure is between about 1.05 and 1.5 times the atmospheric pressure.

In one aspect, the OLED device encapsulation comprises a housing forming an enclosure with the substrate and a first sealant configured to form an oxygen and water vapor barrier for the active region, wherein the enclosure is filled with an inert gas at a pressure higher than an atmospheric pressure, wherein the pressure is about 1.1 times the atmospheric pressure.

The encapsulation can a housing forming an enclosure with the substrate; and a first sealant configured to form an oxygen and water vapor barrier for the active region, wherein the housing has a substantially hexagon shape such that the OLED device is configured to be neighboring six other polygonal OLED devices to form a matrix.

In one aspect, the OLED device encapsulation comprises a housing forming an enclosure with the substrate and a first sealant configured to form an oxygen and water vapor barrier for the active region, wherein the housing is coated with a color or is labeled with a symbol indicative of a light emission color of the active region.

In one aspect, the OLED device encapsulation comprises a housing forming an enclosure with the substrate and a first sealant configured to form an oxygen and water vapor barrier for the active region, wherein the housing comprises one or more of a metal, a conductive plastic, a non-conductive material, a transparent plastic, or a glass with a predetermined shape.

In one aspect, the OLED device encapsulation comprises a housing forming an enclosure with the substrate; and a first sealant configured to form an oxygen and water vapor barrier for the active region, wherein the housing is composed of aluminum.

In one aspect, the OLED device encapsulation comprises a housing forming an enclosure with the substrate; and a first sealant configured to form an oxygen and water vapor barrier for the active region, wherein the first sealant is disposed between the housing and a first side of the substrate, the OLED device further comprising a second sealant disposed on a second side of the substrate, and further wherein an edge portion of the housing substantially encloses an edge of the substrate and is in contact with the second sealant.

In one aspect, the OLED device encapsulation comprises a housing forming an enclosure with the substrate, a first sealant configured to form an oxygen and water vapor barrier for the active region, wherein the first sealant is disposed between the housing and a first side of the substrate, the OLED device further comprising a second sealant disposed on a second side of the substrate, and further wherein an edge portion of the housing substantially encloses an edge of the substrate and is in contact with the second sealant, a third sealant for sealing a gap between the edge portion of the housing and the second side of the substrate.

In one aspect, the OLED device active region is a continuous region forming a single light emitter.

In one aspect, the OLED device active region comprises a plurality of light emitters.

In one aspect, the OLED device FWHM is larger than about 100 nm.

In one aspect, the OLED device is larger than about 200 nm.

In one aspect, the OLED device broadband emission spectrum is one selected from a white, a red, a green, a blue, a yellow, a orange, a cyan, or a magenta spectrum.

In one aspect, the OLED device broadband emission spectrum corresponds to a CRI higher than about 60.

In one aspect, the OLED device broadband emission spectrum corresponds to a CRI higher than about 80.

In one aspect, the OLED device broadband emission spectrum corresponds to a CRI higher than about 90.

In one aspect, the OLED device broadband emission spectrum corresponds to a CRI of about 100.

In one aspect, the OLED device active region is substantially transparent.

In one aspect, the OLED device anode comprises a transparent conductor.

In one aspect, the OLED device anode comprises ITO.

In one aspect, the OLED device cathode comprises a transparent conductor.

In one aspect, the OLED device cathode comprises at least one of an organic or an inorganic material.

In one aspect, the OLED device cathode comprises one of aluminum or copper.

In one aspect, the OLED device further comprises at least one hole injection layer.

In one aspect, the OLED device further comprises at least one hole injection layer and at least one electron transport layer.

In one aspect, the OLED device active region comprises one or a fluorescent emitter, or a phosphorescent emitter.

In one aspect, the OLED device active region comprises one or a polymer emitter, or a small molecule emitter.

In one aspect, the OLED device active region comprises at least one emissive layer, and wherein the at least one emissive layer is formed by one or a solution based process, or vapor deposition processes.

In one aspect, the OLED device further comprises at least one hole injection layer, wherein the at least one hole injection layer comprises an inherently conductive polymer.

In one aspect, the OLED device further comprises at least one hole injection layer, wherein the at least one hole injection layer comprises one or more of a substituted poly-thiophene, a regio-regular substituted poly-thiophene, regio-regular substituted poly-3-thiophene, or a regio-regular substituted poly-thiophene and at least one planarizing agent.

In one aspect, the OLED device further comprises at least one hole injection layer, wherein the at least one hole injection layer is formed by one of a solution based process, or vapor deposition processes.

In one aspect, the OLED device further comprises at least one electron transport layer, wherein the at least one electron transport layer is formed by one or a solution based process, or vapor deposition processes.

In one aspect, the OLED device further comprises a light coupling layer configured to improve light out-coupling.

In one aspect, the OLED device further comprises a light coupling layer configured to improve light out-coupling, wherein the light coupling layer has a lens shaped surface.

In one aspect, the OLED device further comprises a light coupling layer configured to improve light out-coupling, wherein the light coupling layer has a patterned surface forming a grating.

In one aspect, the OLED device further comprises a light coupling layer configured to improve light out-coupling, wherein the light coupling layer comprises a plurality of microlenses.

In one aspect, the OLED device further comprises a light coupling layer configured to improve light out-coupling, wherein the light coupling layer comprises a phosphor layer.

In one aspect, the OLED device further comprises a light coupling layer configured to improve light out-coupling, wherein the light coupling layer is also configured to convert the spectrum to another spectrum of longer wavelength.

In one aspect, the OLED device further comprises a light coupling layer configured to improve light out-coupling, wherein the light coupling layer comprises a quantum-dot-based film configured to convert the spectrum to another spectrum of longer wavelength.

In one aspect, the OLED device further comprises a light coupling layer configured to improve light out-coupling, wherein the light coupling layer comprises a photonic lattice.

In one aspect, the OLED device further comprises a light coupling layer configured to improve light out-coupling, wherein the light coupling layer has a roughened transparent surface.

In one aspect, the OLED device further comprises a light coupling layer configured to improve light out-coupling, wherein the light coupling layer comprises a low refractive index layer.

In one aspect, the OLED device further comprises a light coupling layer configured to improve light out-coupling, wherein the light coupling layer comprises a low refractive index layer composed of an aerogel.

In one aspect, the OLED device further comprises one or more of a hole transporting layer, an electron transporting layer, a hole injecting layer, an electron injecting layer, a hole blocking layer, or an electron blocking layer.

In one aspect, the OLED device active region has a lateral dimension larger than about 0.1 centimeter.

In one aspect, the OLED device active region has a lateral dimension smaller than about 1 meter.

In one aspect, the OLED device active region has a lateral dimension smaller than a characteristic distance for charge transport in the anode.

In one aspect, the OLED device active region has a lateral dimension smaller than a characteristic distance for charge transport in the anode, and wherein the lateral dimension is less than about 10 cm.

In one aspect, the OLED device active region has a lateral dimension of about 1 cm.

In another embodiment, an OLED device is provided. The OLED device comprises a substrate, an anode, a cathode, an active region comprising an organic material, wherein the active region is electrically coupled to the anode and the cathode and is configured to emit a broadband emission spectrum with a FWHM larger than about 50 nm, at least one coupler configured to electrically couple at least one of the anode or the cathode to a power supply, and an encapsulation that isolates the active region from an ambient environment, wherein the active region comprises a plurality of vertically-stacked light emitting layers.

In one aspect, the OLED device active region comprises a plurality of vertically-stacked light emitting layers, wherein at least two of the plurality of vertically-stacked light emitting layers are configured to emit light of different colors.

In one aspect, the OLED device active region comprises a plurality of vertically-stacked light emitting layers, wherein the plurality of vertically-stacked light emitting layers are interlaced with substantially transparent non-emitting layers.

In one aspect, the OLED device active region comprises a plurality of vertically-stacked light emitting layers, wherein the plurality of vertically-stacked light emitting layers are interlaced with substantially transparent non-emitting layers, and wherein the substantially transparent non-emitting layers include a third electrode, wherein the third electrode is electrically addressed differently from the anode or the cathode.

In one aspect, the OLED device active region comprises a plurality of vertically-stacked light emitting layers, wherein the plurality of vertically-stacked light emitting layers are interlaced with substantially transparent non-emitting layers forming a plurality of vertically-stacked transparent OLED chips.

In one aspect, the OLED device active region comprises a plurality of vertically-stacked light emitting layers, wherein the substrate, the cathode, and the anode are substantially transparent such that the OLED device is configured to emit light in both the cathode and the anode directions.

In one aspect, the OLED device active region comprises a plurality of vertically-stacked light emitting layers, wherein at least one of the anode or the cathode is composed of a transparent material selected from a conductive oxide, a metal thin film, or an organic thin film.

In one aspect, the OLED device active region comprises a plurality of vertically-stacked light emitting layers, wherein at least one of the anode or the cathode comprises a reflective material, and wherein the OLED device is configured to be an edge emitting OLED.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, wherein the at least one coupler is configured to electrically couple at least one of the first anode, the second anode, the first cathode, or the second cathode to a power supply via a mount.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, and wherein the at least one coupler is configured to electrically couple at least one of the first anode, the second anode, the first cathode, or the second cathode to a power supply via a second OLED device.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, and wherein the at least one coupler is configured to also mechanically couple the OLED device with a mount or with a second OLED device.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, and wherein the at least one coupler comprises a protrusion configured to be snapped into a indentation on a mount or a second OLED device.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, and wherein the at least one coupler comprises an indentation for a protrusion of a mount or a second device to snap therein.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the housing has a first electrically conductive path disposed in a first hermetic seal through the housing, and wherein the first electrically conductive path is electrically coupled to the cathode.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the housing has a first electrically conductive path in a first hermetic seal through the housing, and wherein the first electrically conductive path is electrically coupled to the cathode, wherein the housing further has a second electrically conductive path through the housing, and wherein the second electrically conductive path is electrically coupled to the anode.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the housing has a first electrically conductive path in a first hermetic seal through the housing, and wherein the first electrically conductive path is electrically coupled to the cathode, wherein the housing further has a second electrically conductive path through the housing, and wherein the second electrically conductive path is electrically coupled to the anode, wherein the second electrically conductive path is through a second hermetic seal.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the electrically conductive housing forms a common anode with neighboring OLED devices.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate, and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the housing has a contoured shape that allows the OLED device to be arranged on a curved surface with a plurality of neighboring OLED devices without causing substantial interference between housings of neighboring OLED devices.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes, and wherein the encapsulation comprises a housing forming an enclosure with the substrate and a first sealant configured to form an oxygen and water vapor barrier for the active region, wherein the housing is electrically conductive, and wherein the first electrically conductive path is electrically isolated from the housing, and further wherein the anode is electrically coupled to the housing, wherein the housing has a contoured shape that allows the OLED device to be arranged on a curved surface with a plurality of neighboring OLED devices without causing substantial interference between housings of neighboring OLED devices, wherein the housing has a slanted side wall and a bottom wall, and wherein a slant angle of the slanted side wall is selected such that, when the OLED device is tightly arranged with a plurality of neighboring OLED devices on a curved surface, housings of neighboring OLED devices do not substantially interfere with each other.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a substantially hexagonal housing forming an enclosure with the substrate.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the encapsulation comprises a housing forming an enclosure with the substrate and a first sealant configured to form an oxygen and water vapor barrier for the active region, wherein the enclosure is filled with an inert gas at a pressure higher than an atmospheric pressure.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes wherein the encapsulation comprises a housing forming an enclosure with the substrate and a first sealant configured to form an oxygen and water vapor barrier for the active region, wherein the housing has a substantially hexagon shape such that the OLED device is configured to be neighboring six other polygonal OLED devices to form a matrix.

In another aspect, an OLED device is provided. The OLED comprises a substrate, a first anode, a hole injection layer adjacent the first anode, a first light emitting layer, a first cathode, a second anode, a second light emitting layer, an electron transport layer, a second cathode, at least one coupler configured to electrically couple at least one of the first anode, the second anode, the first cathode, or the second cathode to a power supply, and an encapsulation that isolates the first and second light emitting layers from an ambient environment, wherein each of the first or second light emitting layers comprises an organic material and is configured to emit a broadband emission spectrum with a FWHM larger than about 50 nm, wherein the first and second light emitting layers are electrically coupled to their respective first and second anodes and cathodes and wherein the first and second light emitting layers are activated independently.

In one aspect, a kit of pre-manufactured modular OLED devices is provided, wherein the OLED devices include at least two types of OLED devices of different colors, each OLED device comprising a substrate, an anode, a cathode, and an active region comprising an organic material, wherein the active region is electrically coupled to the anode and the cathode and is configured to emit a broadband emission spectrum with a FWHM larger than about 50 nm; at least one coupler configured to electrically couple at least one of the anode or the cathode to a power supply; and an encapsulation that isolates the active region from an ambient environment.

In one aspect, the kit further comprises a mount for receiving at least some of the plurality of OLED devices, wherein the mount is configured to electrically couple the power supply and the at least some of the plurality of OLED devices.

In one aspect, the kit further comprises a plurality of conductive couplers, wherein each of the plurality of conductive couplers has at least one conductive surface area and at least one insulating surface area at predetermined locations for electrically coupling one of the OLED devices with another OLED device or with a mount.

In one aspect, the kit is provided wherein at least one of the plurality of OLED devices has one or more via holes for receiving an elongated conductor.

In one aspect, the kit is provided wherein at least one of the plurality of OLED devices has one or more via holes for receiving an elongated conductor, and wherein the elongated conductor is flexible.

In one aspect, the kit is provided wherein at least one of the plurality of OLED devices has one or more via holes for receiving an elongated conductor, and wherein the elongated conductor is configured to also mechanically couple one of the OLED devices with another one of the OLED devices or with a mount.

In one aspect, the kit further comprises an elongated conductor, wherein at least one of the plurality of OLED devices has one or more via holes for receiving the elongated conductor, and wherein the elongated conductor is configured to also mechanically couple one of the OLED devices with another one of the OLED devices or with a mount.

In one aspect, the kit further comprises a flexible elongated conductor, wherein at least one of the plurality of OLED devices has one or more via holes for receiving the flexible elongated conductor.

In one aspect, the kit further comprises a mount, wherein at least one of the plurality of OLED devices is configured to be coupled to the mount.

In one aspect, the kit further comprises a mount and a power supply, wherein at least one of the plurality of OLED devices is configured to be mechanically coupled to the mount, and electrically coupled to the power supply via the mount.

In another embodiment, a method of manufacturing an OLED device is described. The steps comprise: providing a substrate, an anode, a cathode, and an active region comprising an organic material, and a housing, wherein the active region is electrically coupled to the anode and the cathode and is configured to emit a broadband emission spectrum with a full width at half maximum (FWHM) larger than about 50 nm; and assembling the substrate, the anode, the cathode, the active region and the housing to form the OLED device.

In one aspect, the method is provided wherein assembling comprises: disposing the housing over the substrate; and sealing the housing onto the substrate using a first sealant thereby forming an encapsulation that isolates the active region from an ambient environment.

In one aspect, the method is provided wherein the assembling comprises sealing the housing onto the substrate using a first sealant thereby forming an enclosure that isolates the active region from an ambient environment, wherein the sealing is performed in an inert gas at a pressure equal to or higher than an ambient atmospheric pressure.

In one aspect, the method is provided wherein the assembling comprises sealing the housing onto the substrate using a first sealant thereby forming an enclosure that isolates the active region from an ambient environment, wherein the sealing comprises performing the sealing in an inert gas at a pressure equal to or higher than an ambient atmospheric pressure, and wherein the pressure is between about 1.0 and 1.5 times the ambient atmospheric pressure.

In one aspect, the method is provided wherein the assembling comprises sealing the housing onto the substrate using a first sealant thereby forming an enclosure that isolates the active region from an ambient environment, wherein the sealing is performed in an inert gas at a pressure higher than an ambient atmospheric pressure, wherein the substrate is an un-diced substrate, the method further comprising dicing the substrate after sealing the housing onto the substrate.

In one aspect, the method is provided wherein the assembling comprises sealing the housing onto the substrate using a first sealant thereby forming an enclosure that isolates the active region from an ambient environment, wherein the sealing is performed in an inert gas at a pressure equal to or higher than an ambient atmospheric pressure, and wherein the sealing comprises sealing the housing onto a first side of the substrate, the method further comprising: disposing a second sealant over a second side of the substrate opposite a first side that is in contact with the first sealant; and bending an edge portion of the housing around the second sealant.

In one aspect, the method is provided wherein the assembling comprises sealing the housing onto the substrate using a first sealant thereby forming an enclosure that isolates the active region from an ambient environment, wherein the sealing the is performed in an inert gas at a pressure equal to or higher than an ambient atmospheric pressure, and wherein the sealing comprises sealing the housing onto a first side of the substrate, the method further comprising: disposing a second sealant over a second side of the substrate opposite a first side that is in contact with the first sealant; and bending an edge portion of the housing around the second sealant; and sealing a gap between the edge portion of the housing and the OLED chip.

In another embodiment, an OLED device is provided. The OLED device comprises a substrate; an anode; a cathode; an active region comprising an organic material, wherein the active region is electrically coupled to the anode and the cathode; at least one coupler; and an encapsulation that isolates the active region from an ambient environment.

In a further embodiment, the coupler is configured to electrically couple at least one of the anode or the cathode to a power supply.

In one aspect, an OLED device is provided, comprising a substrate; an anode; a cathode; an active region comprising an organic material, wherein the active region is electrically coupled to the anode and the cathode; at least one coupler; and an encapsulation that isolates the active region from an ambient environment, wherein the coupler is configured to mechanically couple the OLED device with a mount or with one or more other OLED devices.

In one aspect, an OLED device is provided, comprising a substrate; an anode; a cathode; an active region comprising an organic material, wherein the active region is electrically coupled to the anode and the cathode; at least one coupler; and an encapsulation that isolates the active region from an ambient environment, wherein the coupler is configured for both electrical and mechanical coupling the OLED device with an article.

In another embodiment, a lighting system is provided, comprising a plurality of OLED devices, wherein each of the OLED devices comprises: a substrate; an anode; a cathode; an active region comprising an organic material, wherein the active region is electrically coupled to the anode and the cathode; at least one coupler configured to electrically couple at least one of the anode or the cathode to a power supply; and an encapsulation that isolates the active region from an ambient environment.

In one aspect, the lighting system further comprises a mount, wherein at least some of the plurality of OLED devices are removably coupled to the mount through their respective couplers.

In one aspect, the lighting system is provided wherein at least some of the plurality of OLED devices have different colors, and wherein the plurality of OLED devices are selected such that the lighting system emits light of desired color characteristics.

In one aspect, the lighting system further comprises: a mount; and an elongated conductor for coupling at least some of the plurality of OLED devices to the mount.

In one aspect, the lighting system farther comprises: a mount; and an elongated conductor for coupling at least some of the plurality of OLED devices to the mount, wherein the elongated conductor has a patterned surface including insulating and conductive regions.

In one aspect, the lighting system farther comprises: a mount including a plurality of conductive layers; and a plurality elongated conductor for coupling at least some of the plurality of OLED devices to the mount, wherein at least some of the plurality of elongated conductor insulating regions at locations corresponding to the plurality of conductive layers.

In one aspect, the lighting system farther comprises: a mount including a plurality of conductive layers; and an elongated conductor for coupling at least some of the plurality of OLED devices to the mount, wherein the elongated conductor has at least two arms, and wherein each of the at least two arms has insulating regions at locations corresponding to the plurality of conductive layers.

In one aspect, the lighting system further comprises: a mount including a plurality of conductive layers; and an elongated conductor for coupling at least some of the plurality of OLED devices to the mount, wherein the elongated conductor is substantially U-shaped.

The FIGS. 1-12 provided herein are exemplary embodiments. Other embodiments can be carried out by one skilled in the art within the spirit and scope of the claims.

What is claimed is:

1. An organic light emitting diode (OLED) device, comprising:
    a substrate;
    an anode;
    a cathode;
    an active region comprising an organic material, wherein the active region is electrically coupled to the anode and the cathode;
    a first coupler configured to electrically couple the anode to a power supply via at least one of (i) a mount, and (ii) a second OLED device;
    a second coupler configured to electrically couple the cathode to a power supply via at least one of (i) the mount, and (ii) the second OLED device; and
    an encapsulation that isolates the active region from an ambient environment,
    wherein each of the first coupler and the second coupler comprises a cylindrical protrusion extending from a surface of the OLED device, and
    wherein each of the first coupler and the second coupler comprises a conductor extending along at least a portion of a cylindrical outer surface of the respective cylindrical protrusions of the first coupler and the second coupler.

2. The OLED device of claim 1, wherein the active region is a continuous region forming a single light emitter.

3. The OLED device of claim 1, wherein the active region comprises a plurality of light emitters.

4. The OLED device of claim 1, wherein the active region is configured to emit a broadband emission spectrum with a full width half max (FWHM) larger than about 50 nm.

5. The OLED device of claim 1, wherein the active region is configured to emit a broadband emission spectrum with a full width half max (FWHM) larger than about 100 nm.

6. The OLED device of claim 1, wherein the active region is configured to emit one of a white, a red, a green, a blue, a yellow, a orange, a cyan, or a magenta spectrum.

7. The OLED device of claim 1, wherein the active region has an emission spectrum that corresponds to a color rendering index (CRI) higher than about 80.

8. The OLED device of claim 1, wherein the cathode comprises a combination of an organic material and an inorganic material.

9. The OLED device of claim 1, wherein the active region comprises at least one of a fluorescent emitter, or a phosphorescent emitter.

10. The OLED device of claim 1, wherein the active region comprises at least one of a polymer emitter, or a small molecule emitter.

11. The OLED device of claim 1, further comprising at least one hole injection layer, wherein the at least one hole injection layer comprises an inherently conductive polymer.

12. The OLED device of claim 1, further comprising at least one hole injection layer, wherein the at least one hole injection layer comprises one or more of a substituted poly-thiophene, a regio-regular substituted poly-thiophene, regio-regular substituted poly-3-thiophene, or a regio-regular substituted poly-thiophene.

13. The OLED device of claim 12, further comprising at least one planarizing agent.

14. The OLED device of claim 1, further comprising a light coupling layer.

15. The OLED device of claim 1, further comprising a light coupling layer configured to convert an output spectrum of the OLED to another spectrum of longer wavelength.

16. The OLED device of claim 1, further comprising one or more of a hole transporting layer, an electron transporting layer, a hole injecting layer, an electron injecting layer, a hole blocking layer, or an electron blocking layer.

17. The OLED device of claim 1, wherein the active region has a lateral dimension larger than about 0.5 centimeter.

18. The OLED device of claim 1, wherein the active region has a lateral dimension smaller than about 1 meter.

19. The OLED device of claim 1, wherein the active region comprises a plurality of vertically-stacked light emitting layers.

20. The OLED device of claim 19, wherein at least two of the plurality of vertically-stacked light emitting layers are configured to emit light of different colors.

21. The OLED device of claim 1, wherein the substrate, the cathode, and the anode are substantially transparent such that the OLED device is configured to emit light in both the cathode and the anode directions.

22. The OLED device of claim 1, wherein at least one of the anode or the cathode comprises a reflective material, and wherein the OLED device is configured to be an edge emitting OLED.

23. A kit comprising:
a plurality of pre-manufactured modular organic light emitting diode (OLED) devices, each OLED device comprising:
a substrate;
an anode;
a cathode;
an active region comprising an organic material, wherein the active region is electrically coupled to the anode and the cathode;
a first coupler configured to electrically couple the anode to a power supply via at least one of (i) a mount, and (ii) a second OLED device;
a second coupler configured to electrically couple the cathode to a power supply via at least one of (i) the mount, and (ii) the second OLED device; and
an encapsulation that isolates the active region from an ambient environment,
wherein each of the first coupler and the second coupler comprises a cylindrical protrusion extending from a surface of the OLED device, and
wherein each of the first coupler and the second coupler comprises a conductor extending along at least a portion of a cylindrical outer surface of the respective cylindrical protrusions of the first coupler and the second coupler.

24. The kit of claim 23, wherein the plurality of OLED devices include at least two types of OLED devices of different color, size, or shape.

25. The kit of claim 23, further comprising a mount configured to receive at least one of the plurality of OLED devices, wherein the mount is configured to electrically couple the power supply and the at least one of the plurality of OLED devices.

26. The kit or claim 23, wherein at least one of the plurality of OLED devices has one or more via holes configured to receive an elongated conductor.

27. The kit of claim 23, wherein at least one of the plurality of OLED devices has one or more via holes configured to receive an elongated conductor, and wherein the elongated conductor is flexible.

28. The kit of claim 23, wherein at least one of the plurality of OLED devices has one or more via holes configured to receive an elongated conductor, and wherein the elongated conductor is configured to also mechanically couple one of the OLED devices with another one of the plurality of OLED devices or with a mount.

29. A lighting system comprising a plurality of organic light emitting diode (OLED) devices, wherein each of the plurality of OLED devices comprises:
a substrate;
an anode;
a cathode;
an active region comprising an organic material, wherein the active region is electrically coupled to the anode and the cathode;
a first coupler configured to electrically couple the anode to a power supply via at least one of (i) a mount, and (ii) a second OLED device;
a second coupler configured to electrically couple the cathode to a power supply via at least one of (i) the mount, and (ii) the second OLED device; and
an encapsulation that isolates the active region from an ambient environment,
wherein each of the first coupler and the second coupler comprises a cylindrical protrusion extending from a surface of the OLED device, and
wherein each of the first coupler and the second coupler comprises a conductor extending along at least a portion of a cylindrical outer surface of the respective cylindrical protrusions of the first coupler and the second coupler.

30. The lighting system of claim 29, wherein at least two of the plurality of OLED devices have different colors, and wherein the plurality of OLED devices are selected or activated such that the lighting system emits light of predetermined color characteristics.

31. The lighting system of claim 29, further comprising:
the mount; and
at least one elongated conductor configured to couple at least one of the plurality of OLED devices to the mount or to another OLED device.

32. The lighting system of claim 29, further comprising:
the mount; and
at least one elongated conductor configured to couple at least one of the plurality of OLED devices to the mount, wherein the elongated conductor has a patterned surface including insulating and conductive regions.

33. The lighting system of claim 29, further comprising:
the mount, wherein the mount includes a plurality of conductive layers; and
a plurality elongated conductors configured to couple at least one of the plurality of OLED devices to the mount, wherein at least one of the plurality of elongated conductors has a patterned surface including insulating and conductive regions, and wherein said conductive regions are configured to electrically connect to at least one of the plurality of conductive layers.

34. The lighting system of claim 29, further comprising:
the mount, wherein the mount includes a plurality of conductive layers; and
an elongated conductor configured to couple at least one of the plurality of OLED devices to the mount, wherein the elongated conductor has at least two arms, and wherein each of the at least two arms has at least one conductive region at a location corresponding to a location of at least one conductive layer.

35. The lighting system of claim 29, further comprising:
the mount, wherein the mount includes a plurality of conductive layers; and
an elongated conductor configured to couple at least one of the plurality of OLED devices to the mount, wherein the elongated conductor is substantially U-shaped.

* * * * *

UNITED STATES PATENT AND TRADEMARK OFFICE
CERTIFICATE OF CORRECTION

| | | |
|---|---|---|
| PATENT NO. | : 8,414,304 B2 | Page 1 of 1 |
| APPLICATION NO. | : 12/543225 | |
| DATED | : April 9, 2013 | |
| INVENTOR(S) | : Mathai et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 241 days.

Signed and Sealed this
Seventh Day of October, 2014

Michelle K. Lee
*Deputy Director of the United States Patent and Trademark Office*